United States Patent
Yamagata et al.

(10) Patent No.: US 6,504,975 B1
(45) Date of Patent: *Jan. 7, 2003

(54) COUPLING LENS AND SEMICONDUCTOR LASER MODULE

(75) Inventors: Michihiro Yamagata, Osaka (JP); Yasuhiro Tanaka, Hyogo (JP); Hiroyuki Asakura, Osaka (JP); Tomohiko Sasano, Osaka (JP)

(73) Assignee: Matsushita Electric Industrial Co., Ltd., Kadoma (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/554,649
(22) PCT Filed: Sep. 10, 1999
(86) PCT No.: PCT/JP99/04968
§ 371 (c)(1), (2), (4) Date: May 17, 2000
(87) PCT Pub. No.: WO00/17691
PCT Pub. Date: Mar. 30, 2000

(30) Foreign Application Priority Data

Sep. 17, 1998 (JP) .......................................... 10-262585

(51) Int. Cl.$^7$ .............................. G02B 6/32; G02B 6/42
(52) U.S. Cl. .......................................... 385/33; 385/93
(58) Field of Search ............................. 385/33–35, 92, 385/93, 37; 359/565, 569, 570, 574, 575, 742, 743, 19; 257/98

(56) References Cited

U.S. PATENT DOCUMENTS

| | | | |
|---|---|---|---|
| 5,031,991 A | * 7/1991 | Nakatsu et al. | |
| 5,040,862 A | 8/1991 | Burton et al. | |
| 5,260,828 A | * 11/1993 | Londono et al. | ............. 359/565 |
| 5,283,446 A | 2/1994 | Tanisawa | |
| 5,412,506 A | * 5/1995 | Feldblum et al. | ............ 359/569 |
| 5,473,471 A | * 12/1995 | Yamagata et al. | ........... 359/569 |
| 5,555,334 A | * 9/1996 | Ohnishi et al. | ................ 385/93 |
| 5,799,030 A | * 8/1998 | Brenner | ........................ 372/50 |
| 5,949,577 A | 9/1999 | Ogata | |
| 6,120,191 A | * 9/2000 | Asakura et al. | ................ 385/93 |

FOREIGN PATENT DOCUMENTS

EP 827 004 3/1998

(List continued on next page.)

OTHER PUBLICATIONS

"Describing holographicoptical elements as lenses", Jounal of the Optical Society of America, vol. 67, No. 6, William C. Sweatt, pp. 803–808, Jun. 1977.

(List continued on next page.)

*Primary Examiner*—Rodney Bovernick
*Assistant Examiner*—Mike Stahl
(74) *Attorney, Agent, or Firm*—Merchant & Gould, P.C.

(57) ABSTRACT

A coupling lens (104) of the present invention is used for coupling a beam of light emitted from a semiconductor laser (101) to an optical fiber (108). The coupling lens (104) is formed of a single lens, and a diffraction lens formed of concentric zones is integrated on an incident surface or an exit surface of the single lens. The diffraction lens has a positive refracting power, a relief function of the diffraction lens has an approximately isosceles triangular shape, and a depth W of the relief function satisfies the following formula:

$$0.6 \leq W(n-1)/\lambda \leq 1.0$$

where n denotes a refractive index of a material of the lens and λ represents a wavelength of the semiconductor laser. When the coupling lens is used as a coupling lens for a semiconductor laser module, the intensity of light emitted from the module is allowed to comply with a safety standard without using an attenuation film or a polarizer, or a control circuit for stopping emission of the laser automatically when the optical fiber comes off.

41 Claims, 23 Drawing Sheets

(A)

FOREIGN PATENT DOCUMENTS

| | | |
|---|---|---|
| JP | 22 1608 | 10/1947 |
| JP | 60 181701 | 9/1985 |
| JP | 61 245594 | 10/1986 |
| JP | 64 29601 | 2/1989 |
| JP | 3 127001 | 5/1991 |
| JP | 4 84103 | 3/1992 |
| JP | 4 97208 | 3/1992 |
| JP | 4 112211 | 9/1992 |
| JP | 5 27140 | 2/1993 |
| JP | 5 60940 | 3/1993 |
| JP | 5 60952 | 3/1993 |
| JP | 5 203845 | 8/1993 |
| JP | 5 241049 | 9/1993 |
| JP | 6 242373 | 9/1994 |
| JP | 7 43563 | 2/1995 |
| JP | 7 104154 | 4/1995 |
| JP | 8 15582 | 1/1996 |
| JP | 9 146007 | 6/1997 |
| JP | 9 304662 | 11/1997 |
| JP | 10 73760 | 3/1998 |
| JP | 10 133104 | 5/1998 |
| JP | 10 68903 | 10/1998 |
| JP | 11 142696 | 5/1999 |
| JP | 11 274646 | 10/1999 |

OTHER PUBLICATIONS

"Efficiency Simulation for Diamond–Turned Diffractive Lenses", Japanese Jounal of Applied Physics, vol. 37, Part 1, No. 6B, Michiko Yamagata et al., pp. 3695–3700, Jun. 1998.

"Athermal diffractive plastic lens for laser module", Extended abstracts of the 45th meeting of the Japan Society of Applied Physics, Yasuhiro Tanaka et al., p. 955, Mar. 1998.

"Athermal laser moduls for Gbit transmission systems", Technical Report of IEICE, vol. 98, No. 251, Hiroyuki Asakura et al., pp 73–77, Aug. 27, 1998.

"Hybrid diffractive–refractive lenses and achromats", Applied Optics, vol. 27, No. 14, Thomas Stone et al., pp. 2960–2971, Jul. 15, 1988.

"Diffractive optics for packaging of laser diodes and fiber–optics", IEEE Electronic Components and Technology Conference, M. R. Feldman et al, pp. 1278–1283, 1996 (no month).

* cited by examiner (A)

(B)

(A)

(B)

(A)

(B)

(A)

(B)

(A)

(B)

(A)

(B)

(C)

COUPLING LENS AND SEMICONDUCTOR LASER MODULE

TECHNICAL FIELD

The present invention relates to a semiconductor laser module and a coupling lens used therein. Particularly, the present invention relates to a low power semiconductor laser module and a coupling lens that are suitable for a short-distance optical communication system.

BACKGROUND ART

In a semiconductor laser module used for optical communication, it is required to couple a semiconductor laser or receiving optics and an optical fiber efficiently. FIG. 23 shows a configuration of a conventional laser module. A semiconductor laser 2302 and a coupling lens 2303 are fixed to a lens holder 2301. The lens holder 2301 is inserted into a connecting holder 2304. To this connecting holder 2304, a ferrule holder 2307 is fixed. An optical fiber 2305 is fixed removably by a ferrule 2306. The coupling lens 2303 is made of glass. A beam of light emitted from the semiconductor laser 2302 is focused on an end face of the optical fiber 2305 by the coupling lens 2303, thus being coupled to the fiber.

In this case, from a safety aspect in handling, it is necessary to restrict the optical output from the laser module to a certain level or lower. Therefore, in addition to the basic configuration shown in FIG. 23, the laser module is provided with: a means for reducing the optical output, such as an attenuation film, a polarizer, or the like, between the semiconductor laser and the optical fiber (for instance, JP 4-97208 A, JP 7-43563 A, or the like); an aperture to control the quantity of light; or a control circuit for stopping emission of the semiconductor laser automatically when the optical fiber comes off.

As a condenser lens, an aspheric lens made of glass has been used conventionally, but for the purpose of cost reduction, a resin lens has come to be used (for instance, JP 5-60952 A, JP 61-245594 A, JP 5-27140 A, JP 5-60940, or the like). In the case of using the resin lens, a refractive index of resin varies with variation in temperature, resulting in variation in the focal length. In addition, its coefficient of thermal expansion is higher than that of a glass material. Therefore, an imaging position varies with variation in temperature, resulting in variation in the coupling efficiency to an optical fiber.

In the semiconductor laser module, an emission wavelength of the semiconductor laser as a light source also varies with variation in temperature. Therefore, it is conceivable that by providing a diffraction lens on the surface of the lens, the variation of focal length of the resin lens with temperature is corrected by the diffraction lens. The reason is that since a focal length of the diffraction lens varies greatly depending on a wavelength of the light source compared to that of a refractive lens, the focal length of the diffraction lens varies more than that of the refractive lens when the wavelength of the light source varies with variation in temperature. In other words, by employing a design enabling the variation in focal length of the diffraction lens to cancels out the variation of focal length with the temperature of the refractive lens, a lens in which the variation in focal length due to variation in temperature has been compensated can be obtained.

In the above-mentioned method of using an attenuation film, a polarizer, or the like for restricting the optical output from the laser module to a certain level or lower, manufacturing cost is high. In the method of controlling the quantity of light by an aperture, the quantity of light varies depending on the processing accuracy of the aperture or variation in flare angle of the laser, and in addition, high assembly accuracy is required. Further, the method of providing a control circuit for stopping emission of the laser automatically when the optical fiber comes off is not preferable, since not only the configuration of a device as a whole becomes complicated but also the manufacturing cost is high.

When a resin lens is used for reducing a lens cost, a diffraction lens is formed on the surface of the lens so as to correct the variation in focal length due to the variation in temperature since the variation in refractive index due to variation in temperature is greater in a resin lens compared to that in a glass lens. As a method of manufacturing such a one-piece lens in which a diffraction lens is integrated, a method of processing a lens or a mold for manufacturing a lens by precision cutting using a diamond bit has been used widely. In this case, since the tip of the diamond bit has finite roundness (a nose radius), a processed relief comes to have a shape with edges rounded due to the nose radius of the bit. In a diffraction lens, generally a sawtooth relief shape is used in many cases. However, when a sawtooth relief is processed by the above-mentioned cutting, the diffraction efficiency at the periphery of the lens deviates from a design value.

This is because a pitch of zones of the diffraction lens becomes shorter at the periphery of the lens, and therefore the influence of deterioration in the relief shape caused by the nose radius of the bit becomes more serious at the periphery compared to the center portion of the lens having a longer pitch. In a lens for optical fiber coupling, when the diffraction efficiency at the periphery of the lens decreases, the same effect as that in the case where an effective NA of the lens is decreased is provided and therefore a spot is enlarged, thus causing the decrease in coupling efficiency to an optical fiber. In order to prevent this, there is a method of using a bit for processing with a sharp tip, but it causes the decrease in productivity, which is therefore not preferable. In order to carry out the processing without impairing the productivity, it is said to be desirable that a bit has a nose radius of at least about 10 μm. In addition, a diffraction lens for temperature compensation requires higher power (refracting power) than that of a diffraction lens for so-called chromatic-aberration correction and as a result, has a shorter pitch of diffraction zones at the periphery of the lens compared to the diffraction lens for chromatic-aberration correction. Therefore, in a conventional diffraction lens having a sawtooth relief shape, there has been a problem that the compatibility between the productivity of the lens and mold and the diffraction efficiency performance cannot be obtained.

When using a diffraction lens, a plurality of focal spots corresponding to respective diffraction orders are generated on an optical axis. In order to reduce the intensity of light emitted from a module, an aperture is provided at a position of a focal spot corresponding to a diffraction order used for coupling, thus intercepting lights focused on focal spots corresponding to unnecessary diffraction orders. In this case, lights focused on focal spots with longer focal lengths than that of a focal spot corresponding to the diffraction order used for coupling tend to go through the aperture compared to lights focused on focal spots with shorter focal lengths. In the case of a conventional diffraction lens with a sawtooth relief, when its shape is varied by cutting, unwanted lights tend to be focused on the focal spots corresponding to lower orders and cannot be intercepted by the aperture completely, which has been a problem.

DISCLOSURE OF THE INVENTION

In view of the above points, the present invention is intended to provide an inexpensive optical coupler in which the diffraction efficiency of a diffraction lens formed on a surface of a lens is adjusted and therefore an attenuation film or a polarizer for restricting optical output from a laser module to a certain level or lower, or a control circuit for stopping emission automatically when an optical fiber comes off is not required.

In order to achieve the above-mentioned object, the present invention employs the following configurations.

A coupling lens according to a first configuration of the present invention is used for coupling a beam of light emitted from a semiconductor laser to an optical fiber. The coupling lens is formed of a single lens. On either one of an incident plane and an outgoing-side plane of the single lens, a diffraction lens formed of concentric zones is integrated. The diffraction lens has a positive refracting power, and a relief function of the diffraction lens has an approximately isosceles triangular shape. The depth W of the relief function satisfies the following formula:

$$0.6 \leq W(n-1)/\lambda \leq 1.0.$$

Preferably, it satisfies the following formula:

$$0.6 < W(n-1)/\lambda < 1.0.$$

In the above formulae, W indicates the depth of the relief function, n denotes a refractive index of a lens material, and $\lambda$ represents a wavelength of the semiconductor laser.

The coupling lens according to the first configuration has a relief with an approximately isosceles triangular shape and therefore has excellent productivity even when manufactured by a mold processed by cutting using a diamond bit. The coupling lens has approximately uniform diffraction efficiency from its center to periphery and thus has excellent focusing performance.

A coupling lens according to a second configuration of the present invention is used for coupling a beam of light emitted from a semiconductor laser to an optical fiber. The coupling lens is formed of a single lens. On either one of an incident plane and an outgoing-side plane of the single lens, a diffraction lens formed of concentric zones is integrated. The diffraction lens has a positive refracting power, and a relief function of the diffraction lens has an approximately triangular shape with its apex at a location between 25% and 45% of a relief period. The depth W of the relief function satisfies the following formula:

$$0.9 \leq W(n-1)/\lambda \leq 1.2.$$

Preferably, it satisfies the following formula:

$$0.9 < W(n-1)/\lambda < 1.2.$$

In the above formulae, W indicates the depth of the relief function, n denotes a refractive index of a lens material, and $\lambda$ represents a wavelength of the semiconductor laser.

The coupling lens according to the second configuration has an approximately triangular wavy relief shape. Therefore, the coupling lens focuses unwanted light on focal spots corresponding to higher diffraction orders than that used for optical fiber coupling, thus decreasing leakage of unwanted light from an aperture for intercepting the unwanted light.

In the coupling lens according to the second configuration, it is preferable that the relief function of the diffraction lens has an approximately triangular shape with its apex at a location between 30% and 40% of a relief period and the depth W of the relief function satisfies the following formula:

$$1.0 \leq W(n-1)/\lambda \leq 1.1$$

In the coupling lens according to the first or second configuration, it is preferable that first-order diffracted light from the diffraction lens is used for optical fiber coupling, and when the diffraction efficiency of zero-order diffracted light is $\eta_0$ and the diffraction efficiency of second-order diffracted light is $\eta_2$, the following formula is satisfied:

$$\eta_0 < \eta_2.$$

Further, in the coupling lens according to the first or second configuration, it is preferable that the diffraction efficiency $\eta_0$ of zero-order diffracted light from the diffraction lens satisfies the following formula:

$$\eta_0 < 7\%.$$

A coupling lens according to a third configuration of the present invention is used for coupling a beam of light emitted from a semiconductor laser to an optical fiber. The coupling lens is formed of a single lens. On either one of an incident plane and an outgoing-side plane of the single lens, a diffraction lens formed of concentric zones is integrated. The diffraction lens has a positive refracting power and is processed so as to be uncentered with respect to an axis of rotational symmetry of a refractive lens.

In the coupling lens of the third configuration, since the diffraction lens is processed so as to be uncentered with respect to the axis of rotational symmetry of the refractive lens, lights with different diffraction orders from a location of the refractive lens corresponding to its axis of rotational symmetry are focused on focal spots different both in focal length and image height. Therefore, unwanted light can be intercepted easily, thus relaxing processing accuracy and assembly accuracy of an aperture.

In each coupling lens of the first to third configurations, it is preferable that when the diffraction efficiency of a diffracted light with an order used for optical fiber coupling out of diffracted lights from the diffraction lens is $\eta$, the following formula is satisfied:

$$25\% \leq \eta \leq 40\%$$

and more preferably, $$25\% < \eta < 40\%.$$

In each coupling lens of the first to third configurations, it is preferable that when the diffraction efficiency of a diffracted light with an order used for optical fiber coupling out of diffracted lights from the diffraction lens is $\eta$, the following formula is satisfied:

$$30\% \leq \eta \leq 37\%$$

and further preferably, $$30\% < \eta < 37\%.$$

In each coupling lens of the first to third configurations, it is preferable that a wavelength $\lambda$ of the semiconductor laser satisfies the following formula:

$$700 \text{ nm} < \lambda < 1400 \text{ nm}.$$

In each coupling lens of the first to third configurations, it is preferable that a material of the lens is resin, and the diffraction lens is designed so that when a refractive index of the resin material and a wavelength of the semiconductor laser vary due to variation in temperature, the variation in focal length of the lens due to variation in the refractive index is corrected by the variation in focal length of the diffraction lens due to variation in the wavelength.

Since the coupling lens has a configuration in which the diffraction lens is integrated so as to correct the variation in focal length caused by variation in temperature, inexpensive resin can be used as a material of the lens, thus reducing the cost of the lens.

In each coupling lens of the first to third configurations, it is preferable that a material of the lens is resin and when a focal length of the lens as a whole is f and a focal length of the diffraction lens is fd, the following formula is satisfied:

$$2 < fd/f < 5.$$

According to this, the above-mentioned temperature compensation function can be provided.

A semiconductor laser module according to a first configuration of the present invention includes, at least: a semiconductor laser; an optical fiber; a fixing member for fixing an incident end of the optical fiber; and a coupling lens for allowing a beam of light emitted from the semiconductor laser to form an image on the incident end of the optical fiber. The coupling lens is any one of the first to third coupling lenses.

In the semiconductor laser module of the first configuration, since any one of the above-mentioned coupling lenses of the present invention is used, when intercepted using an aperture, the unwanted light can be intercepted easily, thus relaxing processing accuracy and assembly accuracy of the aperture. Consequently, a semiconductor laser module can be provided at a low cost.

In the semiconductor laser module of the first configuration, it is preferable that a wavelength $\lambda$ of the semiconductor laser satisfies the following formula:

$$700\ nm < \lambda < 1400\ nm.$$

A semiconductor laser module according to a second configuration of the present invention includes, at least: a semiconductor laser; an optical fiber; a fixing member for fixing an incident end of the optical fiber; and a coupling lens for allowing a beam of light emitted from the semiconductor laser to form an image on the incident end of the optical fiber. The coupling lens is the coupling lens according to claim 1, 2 or 6 and is fixed so as to be tilted with respect to an optical axis.

In the semiconductor laser module of the second configuration, since the coupling lens of the present invention is fixed so as to be tilted with respect to the optical axis, focal spots of diffracted lights with orders that are not used for optical fiber coupling are generated at positions different both in focal length and image height. Therefore, the processing accuracy and assembly accuracy of an aperture for intercepting unwanted light can be relaxed. As a result, the semiconductor laser module can be manufactured at a low cost.

In the semiconductor laser module of the second configuration, it is preferable that a wavelength $\lambda$ of the semiconductor laser satisfies the following formula:

$$700\ nm < \lambda < 1400\ nm.$$

A coupling lens according to a fourth configuration of the present invention is used for coupling a beam of light emitted from a semiconductor laser to an optical fiber. The coupling lens is made of glass and is formed of a single lens. On either one of an incident plane and an outgoing-side plane of the single lens, a diffraction grating is formed.

Since the coupling lens of the fourth configuration is made of glass and the diffraction grating is formed on a surface of the lens, unwanted diffracted light that is not used for coupling can be separated on an image surface.

In the coupling lens of the fourth configuration, it is preferable that zero-order diffracted light from the diffraction grating is used for optical fiber coupling and the diffraction efficiency $\eta_0$ of the zero-order diffracted light satisfies the following formula:

$$25\% \leq \eta_0 \leq 40\%.$$

More preferably, the diffraction efficiency $\eta_0$ satisfies the following formula:

$$25\% < \eta_0 < 40\%.$$

Furthermore, in the coupling lens of the fourth configuration, it is preferable that zero-order diffracted light from the diffraction grating is used for optical fiber coupling and the diffraction efficiency $\eta_0$ of the zero-order diffracted light satisfies the following formula:

$$30\% \leq \eta_0 \leq 37\%.$$

More preferably, the diffraction efficiency $\eta_0$ satisfies the following formula:

$$30\% < \eta_0 < 37\%.$$

A semiconductor laser module according to a third configuration of the present invention includes, at least: a semiconductor laser; an optical fiber; a fixing member for fixing an incident end of the optical fiber; and a coupling lens for allowing a beam of light emitted from the semiconductor laser to form an image on the incident end of the optical fiber. The coupling lens is the coupling lens of the fourth configuration.

In the semiconductor laser module of the third configuration, since the aforementioned coupling lens is used, the output power can be reduced to be within a safety standard without using a safety circuit or a specific coating. Thus, the semiconductor laser module can be manufactured at a low cost.

In the semiconductor laser module of the third configuration, it is preferable that a wavelength $\lambda$ of the semiconductor laser satisfies the following formula:

$$700\ nm < \lambda < 1400\ nm.$$

A coupling lens according to a fifth configuration of the present invention is used for coupling a beam of light emitted from a semiconductor laser to an optical fiber. The coupling lens is formed of a single lens. On either one of an incident plane and an outgoing-side plane of the single lens, a diffraction lens formed of concentric zones is integrated. The diffraction lens has a positive refracting power. When the diffraction efficiency of a diffracted light with an order used for optical fiber coupling out of diffracted lights from the diffraction lens is $\eta$, the following formula is satisfied:

$$25\% \leq \eta \leq 40\%.$$

More preferably, the following formula is satisfied:

$$25\% < \eta < 40\%.$$

In the coupling lens of the fifth configuration, the diffraction efficiency is designed considering the power of the light source and losses in the quantity of light in the lens and in the fiber coupling. Therefore, when the coupling lens is used in a semiconductor laser module, the output power of the module can be adjusted to be a suitable value.

In the coupling lens of the fifth configuration, it is preferable that when the diffraction efficiency of a diffracted light with an order used for optical fiber coupling out of diffracted lights from the diffraction lens is η, the following formula is satisfied:

$$30\% \leq \eta \leq 37\%.$$

Further, it is more preferable that the following formula is satisfied:

$$30\% < \eta < 37\%.$$

In the coupling lens of the fifth configuration, it is preferable that a relief function of the diffraction lens has an approximately triangular shape with its apex at a location between 25% and 50% of a relief period, and when the location of the apex is X and the depth of the relief function is W, W satisfies the following formula:

$$-2.5X+1.66 \leq W(n-1)/\lambda \leq -1.6X+1.8.$$

In the coupling lens of the fifth configuration, it is more preferable that a relief function of the diffraction lens has an approximately triangular shape with its apex at a location between 25% and 50% of a relief period, and when the location of the apex is X and the depth of the relief function is W, W satisfies the following formula:

$$-2.5X+1.75 \leq W(n-1)/\lambda \leq -1.6X+1.71.$$

In the coupling lens of the fifth configuration, it is more preferable that a relief function of the diffraction lens has an approximately triangular shape with its apex at a location between 25% and 50% of a relief period, and when the location of the apex is X and the depth of the relief function is W, W satisfies the following formula:

$$-2.4X+1.67 \leq W(n-1)/\lambda \leq -1.94X+1.86.$$

In the coupling lens of the fifth configuration, it is preferable that a relief function of the diffraction lens has an approximately triangular shape with its apex at a location between 25% and 50% of a relief period, and when the location of the apex is X and the depth of the relief function is W, W satisfies the following formula:

$$-2.4X+1.76 \leq W(n-1)/\lambda \leq -1.94X+1.77.$$

According to the above-mentioned respective preferable configurations, since the relief depth of the diffraction lens is adjusted suitably depending on the location of the apex, the light used for optical fiber coupling can be adjusted to have an intensity most suitable for a module.

In the coupling lens of the fifth configuration, it is preferable that a relief function of the diffraction lens has an approximately triangular shape with its apex at a location between 30% and 40% of a relief period.

In the coupling lens of the fifth configuration, it is preferable that a wavelength λ of the semiconductor laser satisfies the following formula:

$$700 \text{ nm} < \lambda < 1400 \text{ nm}.$$

In the coupling lens of the fifth configuration, it is preferable that a material of the lens is resin and the diffraction lens is designed so that when a refractive index of the resin material and a wavelength of the semiconductor laser vary due to variation in temperature, the variation in focal length of the lens due to variation in the refractive index is corrected by the variation in focal length of the diffraction lens due to variation in the wavelength.

In the coupling lens of the fifth configuration, it is preferable that a material of the lens is resin, and when a focal length of the lens as a whole is f and a focal length of the diffraction lens is fd, the following formula is satisfied:

$$2 < fd/f < 5.$$

A semiconductor laser module according to a fourth configuration of the present invention includes, at least: a semiconductor laser; an optical fiber; a fixing member for fixing an incident end of the optical fiber; and a coupling lens for allowing a beam of light emitted from the semiconductor laser to form an image on the incident end of the optical fiber. The coupling lens is the coupling lens of the fifth configuration.

In the semiconductor laser module of the fourth configuration, the coupling lens of the present invention is used. Therefore, even when a module is constructed using a high output power laser source for high-speed communication, a suitable output power can be obtained, which does not exceed the upper limit output power prescribed in the ANSI standard and is at least the lowest output power required for optical fiber communication.

A coupling lens according to a sixth configuration of the present invention is used for coupling a beam of light emitted from a semiconductor laser to an optical fiber. The coupling lens is a pair of lenses of a refractive lens and a diffraction lens formed of concentric zones. The diffraction lens has a positive refracting power. When the diffraction efficiency of a diffracted light with an order used for optical fiber coupling out of diffracted lights from the diffraction lens is η, the following formula is satisfied:

$$25\% \leq \eta \leq 40\%.$$

Preferably, the following formula is satisfied:

$$25\% < \eta < 40\%.$$

Since the coupling lens of the sixth configuration is formed of the pair of lenses of the refractive lens and the diffraction lens, a lens formed by a photolithography technique can be used as the diffraction lens. Thus, the coupling lens can be formed at a low cost.

In the coupling lens of the sixth configuration, it is preferable that when the diffraction efficiency of a diffracted light with an order used for optical fiber coupling out of diffracted lights from the diffraction lens is η, the following formula is satisfied:

$$30\% \leq \eta \leq 37\%.$$

Further, it is more preferable that the following formula is satisfied:

$$30\% < \eta < 37\%.$$

In the coupling lens of the sixth configuration, it is preferable that a wavelength λ of the semiconductor laser satisfies the following formula:

$$700 \text{ nm} < \lambda < 1400 \text{ nm}.$$

In the coupling lens of the sixth configuration, it is preferable that a material of the lens is resin and the diffraction lens is designed so that when a refractive index of the resin material and a wavelength of the semiconductor laser vary due to variation in temperature, the variation in focal length of the lens due to variation in the refractive index is corrected by the variation in focal length of the diffraction lens due to variation in the wavelength.

Since the coupling lens of such a preferable configuration is designed so that the variation in focal length due to variation in temperature of the refractive lens is corrected by the diffraction lens, an inexpensive resin material can be used as a material of the coupling lens, thus reducing the cost of the lens.

In the coupling lens of the sixth configuration, it is preferable that a material of the refractive lens is resin, and when a focal length of the lens as a whole is f and a focal length of the diffraction lens is fd, the following formula is satisfied:

$$2 < fd/f < 5.$$

In the coupling lens of the sixth configuration, it is preferable that a relief shape of the diffraction lens is formed of step-wise zones.

In the coupling lens of the sixth configuration, it is preferable that the diffraction lens is fixed with the centers of concentric zones of the diffraction lens being uncentered with respect to an optical axis of the refractive lens.

In the coupling lens of such a preferable configuration, since the diffraction lens is positioned so as to be uncentered with respect to the refractive lens, diffracted light can be separated in a direction of the optical axis and in a direction perpendicular to the optical axis. Therefore, when it is used in a semiconductor laser module, the processing accuracy of an aperture for intercepting unwanted light can be relaxed.

A semiconductor laser module according to a fifth configuration of the present invention includes, at least: a semiconductor laser; an optical fiber; a fixing member for fixing an incident end of the optical fiber; and a coupling lens for allowing a beam of light emitted from the semiconductor laser to form an image on the incident end of the optical fiber. The coupling lens is the coupling lens of the sixth configuration.

In the semiconductor laser module of the fifth configuration, a coupling lens formed of the above-mentioned pair of lenses is used and therefore a module can be constructed using an inexpensive lens.

In the semiconductor laser module of the fifth configuration, it is preferable that a wavelength λ of the semiconductor laser satisfies the following formula:

$$700 \text{ nm} < \lambda < 1400 \text{ nm}.$$

A semiconductor laser module according to a sixth configuration of the present invention includes, at least: a semiconductor laser, an optical fiber, a fixing member for fixing an incident end of the optical fiber, and a coupling lens for allowing a beam of light emitted from the semiconductor laser to form an image on the incident end of the optical fiber. A diffraction grating is positioned between the coupling lens and the optical fiber.

Since in the semiconductor laser module of the sixth configuration, a diffraction grating is positioned in an optical path, unwanted light can be separated on a surface of an aperture and therefore the processing accuracy of the aperture can be relaxed.

In the semiconductor laser module of the sixth configuration, it is preferable that when the diffraction efficiency of a diffracted light with an order used for optical fiber coupling out of diffracted lights from the diffraction grating is η, the following formula is satisfied:

$$25\% \leq \eta \leq 40\%.$$

Further, it is more preferable that the following formula is satisfied:

$$25\% < \eta < 40\%.$$

In the semiconductor laser module of the sixth configuration, it is preferable that a wavelength λ of the semiconductor laser satisfies the following formula:

$$700 \text{ nm} < \lambda < 1400 \text{ nm}.$$

BRIEF DESCRIPTION OF DRAWINGS

FIG. 1(A) is an optical path diagram, and

FIG. 1(B) is a front view of the coupling lens.

FIG. 13(A) is a structural view, and

FIG. 13(B) is a partially enlarged schematic view.

FIG. 15(A) is an optical path diagram, and

FIG. 15(B) is a front view of the coupling lens.

FIG. 17(A) is an optical path diagram, and

FIG. 17(B) is a front view of the coupling lens.

FIG. 19(A) is an optical path diagram, and

FIG. 19(B) is a front view of a diffraction lens.

FIG. 20(A) is a perspective view, and

FIG. 20(B) is a sectional view in a plane including an optical axis.

FIG. 21(A) is a structural view,

FIG. 21(B) is a front view of a diffraction lens according to the eleventh example, and FIG. 21(C) is a front view of a diffraction lens according to the twelfth example.

FIG. 22(A) is a structural view, and

FIG. 22(B) is a front view of a diffraction grating.

BEST MODE FOR CARRYING OUT THE INVENTION

First Embodiment

Figure 1:
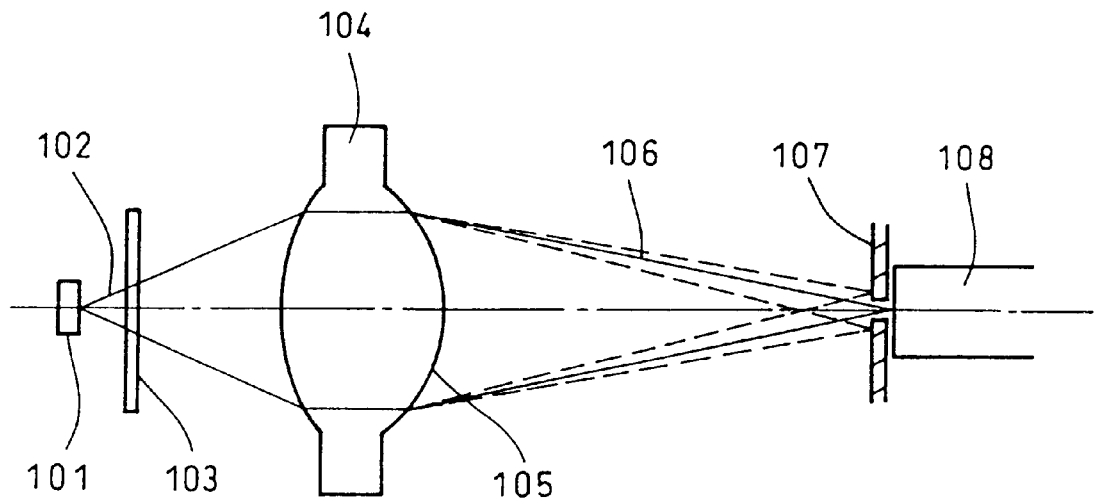
FIG. 1 shows a coupling lens according to a first example of the present invention.
Figure 1:
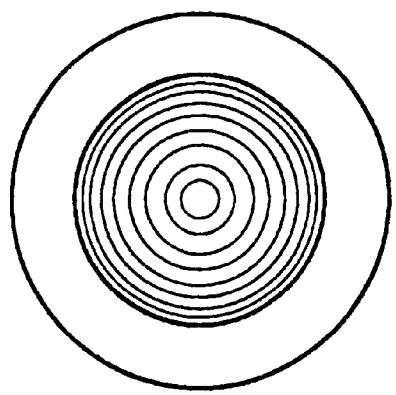

In an optical system of a semiconductor laser module using a resin lens as a coupling lens, when the temperature varies, a refractive index of resin as a material of the lens varies with the variation in temperature. In addition, a semiconductor laser as a light source also varies in emission wavelength. In this case, the coupling lens made of resin varies in focal length by being affected by both the variations in refractive index of the resin and emission wavelength, but the influence by the variation in refractive index dominates. A diffraction lens has a constant focal length even when the refractive index of the lens material varies. However, the diffraction lens varies in focal length with the variation in wavelength more sensitively compared to a refractive lens. Therefore, by combining a resin lens and a diffraction lens, the variation in focal length according to the variation in refractive index of the resin material can be corrected by the variation in focal length of the diffraction lens according to the variation in emission wavelength. In actual use, it is not necessary to correct the variation in focal position of the resin lens completely, and in many cases it is sufficient to reduce the variation only to be below about one third. In this case, the diffraction lens has a positive refracting power, and when the focal length of the lens as a whole is f and the focal length of the diffraction lens is fd, it is sufficient when the following formula is satisfied:

$$2 < fd/f < 5.$$

In this connection, it has been known that such a one-piece lens in which a diffraction lens is integrated can be designed using a method of utilizing a virtual high refractive index (for instance, William C. Sweatt: "Describing Holographic Optical Elements as Lenses", J. Opt. Soc. Am., Vol. 67, No. 6, (1997)).

It is necessary to determine diffraction efficiency considering the output power of a semiconductor laser source used as a light source, a numerical aperture of a lens, coupling efficiency of a fiber, the lower limit of a fiber output standard, and the upper limit of a safety standard of output power from a module. Generally, in a lens for optical fiber coupling, when the numerical aperture on the light source side is 0.2 to 0.4 and that on the fiber side is about 0.1 to 0.2 and when the output power of the semiconductor laser as a light source is about 0 to 2 dbm, the diffraction efficiency of the lens can be determined suitably within a range of 25 to 40% (more preferably, 30 to 37%).

As a light source for an optical fiber module, a semiconductor laser whose wavelength $\lambda$ is about 700 to 1400 nm is used in many cases.

In this case, by suitable selection of a relief shape of the diffraction lens, a function for reducing the intensity of light emitted from the module can be added to the lens. The lens is produced by resin molding using a mold processed by cutting using a diamond bit or by direct cutting of a resin material. Therefore, in designing the relief shape, sufficient consideration must be given to processing conditions.

A specific design example of a resin lens to which a relief shape of the present invention is applied is described as follows.

FIRST EXAMPLE

FIG. 1(A) is a diagram showing an optical path of a coupling lens according to the present example. A beam of light 102 emitted from a light source 101 passes through a window member 103 of a laser and then enters a coupling lens 104 of the present invention. A diffraction lens for correcting variation in focal position due to variation in temperature is formed on an outgoing-side plane 105 of the coupling lens 104. A front view of this diffraction lens is shown in FIG. 1(B). The diffraction lens is formed of concentric zones with their centers on an optical axis of the lens. Out of the diffracted lights from the diffraction lens, first-order diffracted light 106 passes through an aperture 107 to form an image on an end face of an optical fiber 108. Diffracted lights (indicated with broken lines in the figure) other than that form images at positions different from the end face of the optical fiber 108. Therefore, the beams of light are spread on an end face of the aperture 107 and thus are intercepted by the aperture 107.

Table 1 shows design data using virtual high refractive indexes in an optical system shown in FIG. 1.

TABLE 1

| Plane Nos. | Radius of Curvature (1/c) | Surface Separation | Refractive Index |
|---|---|---|---|
| 1 | 0.000000 | 0.1407 | 1 |
| 2 | 0.000000 | 0.3000 | 1.480000 |
| 3 | 0.000000 | 1.0000 | 1 |

TABLE 1-continued

| Plane Nos. | Radius of Curvature (1/c) | Surface Separation | Refractive Index |
|---|---|---|---|
| 4* | 1.183841 | 1.0000 | 1.523306 |
| 5* | −1.257000 | 0.0000 | 7901.000000 |
| 6* | −1.256950 | 2.4151 | 1 |
| 7 | 0.000000 | 0.0000 | 1 |

A design wavelength λ of this lens is 780 nm, a focal length of the lens as a whole is 1.093 mm, a focal length of the diffraction lens is 4 mm, and a conjugate distance is 4.856 mm. This lens has a configuration in which first-order diffracted light is used for optical fiber coupling. In Table 1, the plane of No. 1 is of the light source, the planes of Nos. 2 and 3 are of the window member of the laser, the planes of Nos. 4 to 6 are of the coupling lens, and the plane of No. 7 is of the end face of the optical fiber.

The planes indicated with a mark * are aspheric surfaces expressed by the following formula:

$$x = \frac{ch^2}{1 + \sqrt{1 - (1+k)c^2 h^2}} + A_4 h^4 + A_6 h^6 + A_8 h^8 + A_{10} h^{10}.$$

Coefficients of the aspheric surfaces are shown in Table 2.

TABLE 2

|  | 4 | 5 | 6 |
|---|---|---|---|
| k | −9.72684 × 10⁻¹ | 7.44535 × 10⁻¹ | 7.44414 × 10⁻¹ |
| $A_4$ | −3.79205 × 10⁻¹ | −2.43250 × 10⁻² | −2.43133 × 10⁻² |
| $A_6$ | 3.87138 × 10⁻¹ | 2.62887 × 10⁻¹ | 2.62850 × 10⁻¹ |
| $A_8$ | 3.16389 | 1.79167 | 1.79187 |
| $A_{10}$ | −9.42199 | −4.45550 | −4.45597 |

In the present invention, diffraction orders of a diffraction lens are counted from a zero-order indicating no diffraction and subsequently as a first-order, a second-order, . . . toward the shorter focal-length side sequentially and as a negative first-order, a negative second-order, . . . toward the longer focal-length side sequentially.

Figure 2:
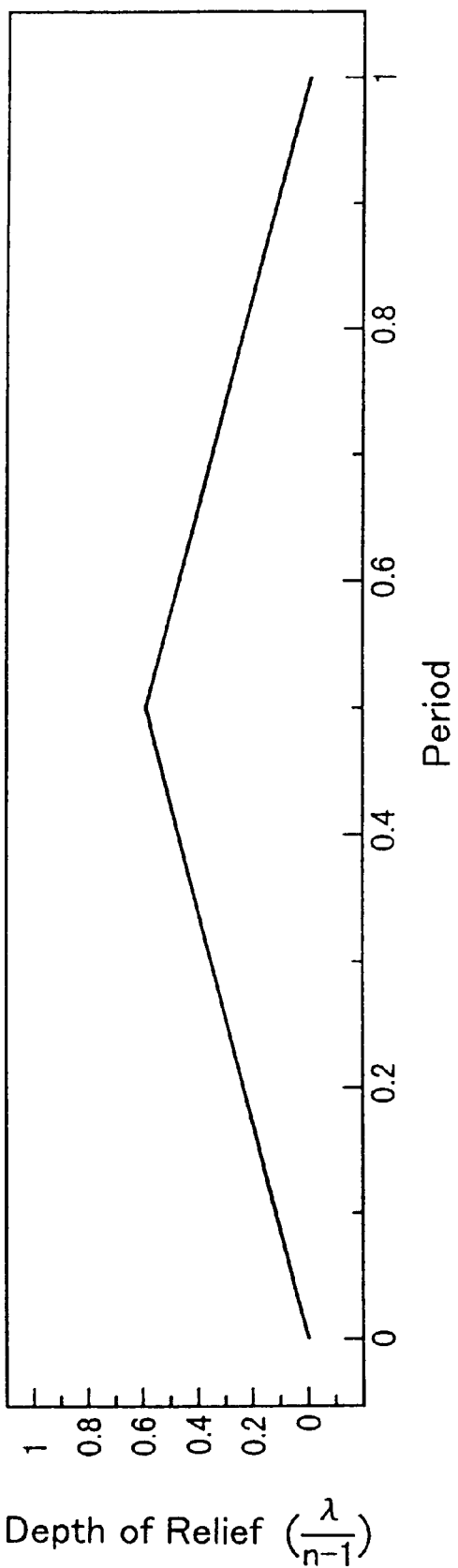
FIG. 2 is a graph showing a shape function of a relief of the coupling lens according to the first example of the present invention.

FIG. 2 shows a shape function of a relief of the lens according to the present example. The depth of the relief in the vertical axis in the figure is indicated in a unit of λ/(n−1). This shape function of the relief has a so-called approximately isosceles triangular shape with its apex at a location exactly corresponding to 50% in a periodical direction and the depth of the relief is 0.6×λ/(n−1).

Figure 3:
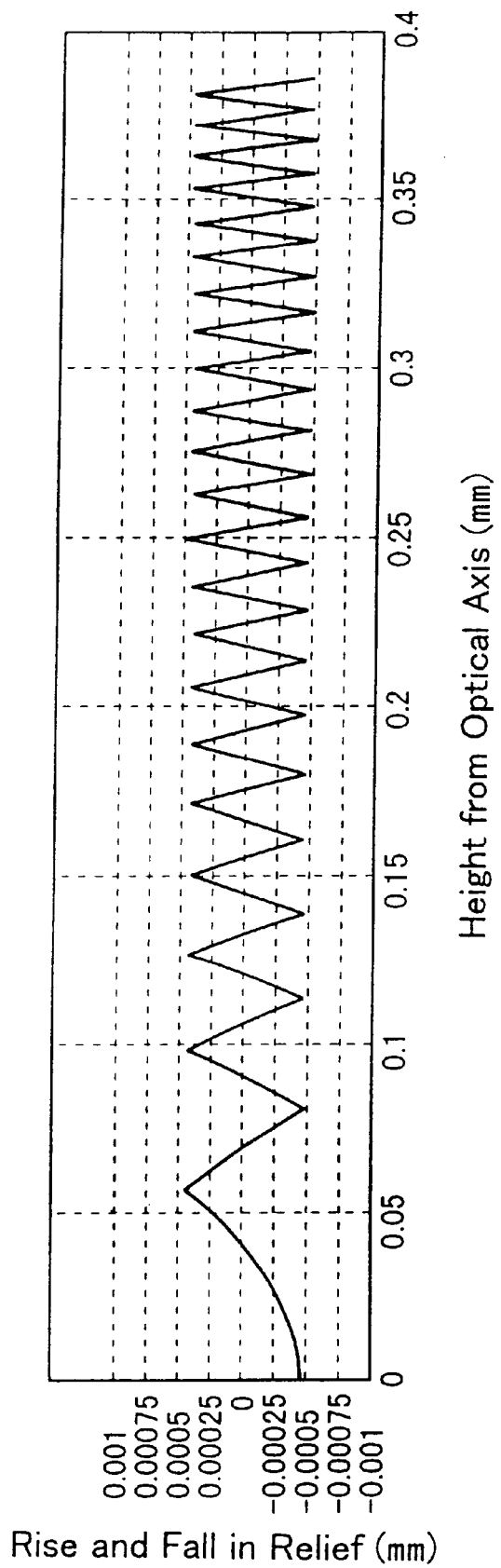
FIG. 3 is a graph showing a relief shape for processing the coupling lens according to the first example of the present invention.

FIG. 3 shows calculation results of the relief shape to be processed on a lens surface by modulating the design relief function indicated in FIG. 2 depending on a phase lag amount of a virtual high refractive index layer according to the above-mentioned lens design data. In FIG. 3, the horizontal axis indicates the height from an optical axis of the lens and the vertical axis indicates rise and fall in a relief with respect to the aspheric surface, both of which are indicated in a unit of mm In this case, the relief shape varies from an isosceles shape in the vicinity of the center of the lens. This is because the phase of the high refractive index layer varies substantially quadratic functionally.

Figure 4:
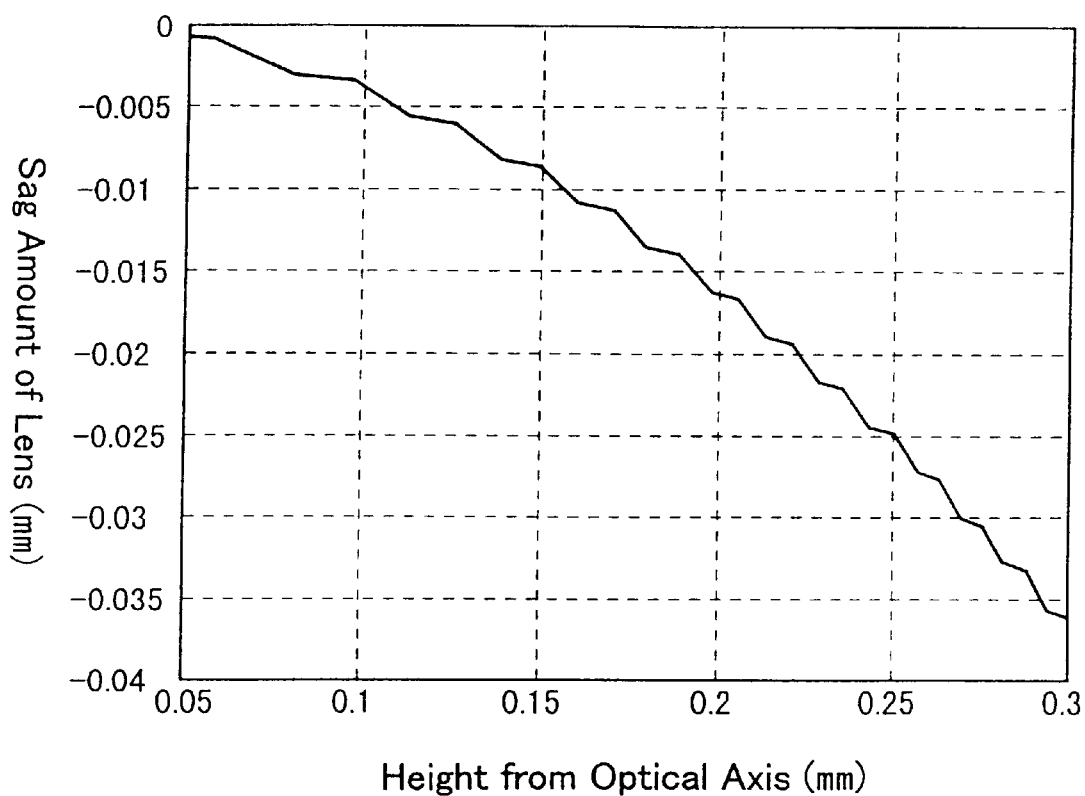
FIG. 4 is a graph showing a sag amount of a surface on which a diffraction lens is formed in the coupling lens according to the first example of the present invention.

FIG. 4 is a graph obtained by plotting a part of the sag of a surface on which a diffraction lens is formed. In FIG. 4, the horizontal axis indicates height from the optical axis and the vertical axis a sag amount of the lens. In the figure, the sag amount is negative, since coordinate axes are set so that a fiber direction is positive in the optical system shown in FIG. 1.

The relief shape of an approximately isosceles triangular shape shown in FIG. 2 enables an angle of the apex of the relief to be a maximum. When a mold is produced by cutting using a bit, the tip of the apex of the relief is rounded off due to a nose radius of the bit. In this case, it is necessary to make the angle of the apex of the relief as large as possible in order to lessen the shape deterioration due to the cutting. In the relief shape of the present invention, a large angle of the apex can be obtained, and therefore the relief shape is not deteriorated greatly by cutting, thus reducing deviation from the design.

Figure 5:
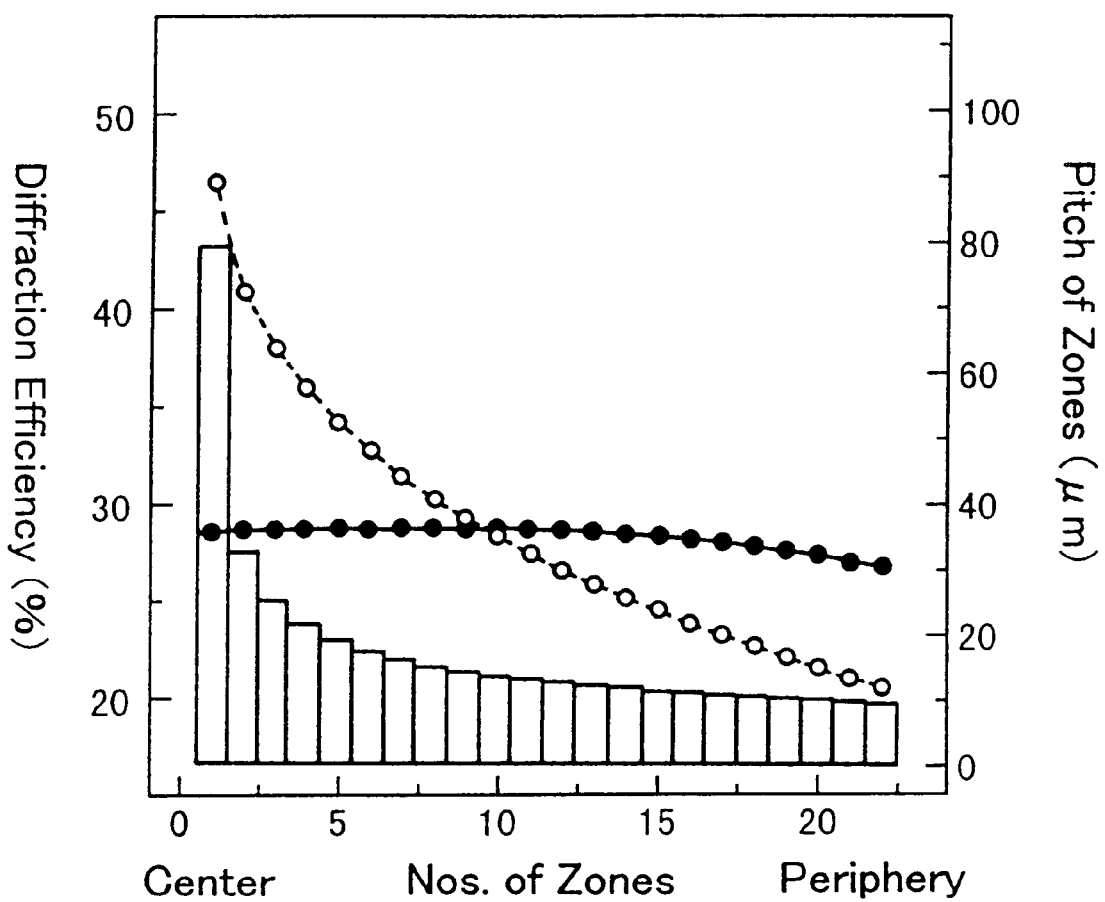
FIG. 5 is a graph showing calculation results of diffraction efficiency of respective zones in the diffraction lens of the coupling lens according to the first example of the present invention.

In the case based on the premise that the relief shape of the present example is processed using a bit with a nose radius of 10 μm, calculation results of diffraction efficiency of respective zones are plotted with black dots in FIG. 5. In FIG. 5, the bar graph shows a pitch of the respective zones, and the plot with white dots shows diffraction efficiency of the respective zones when a conventional sawtooth relief is formed. It can be seen from the figure that the relief shape of the present example is obviously more excellent in uniformity of the diffraction efficiency compared to the conventional sawtooth shape. In this case, the diffraction efficiency of the lens as a whole is 28% both in the present invention and in the conventional sawtooth shape.

Figure 6:
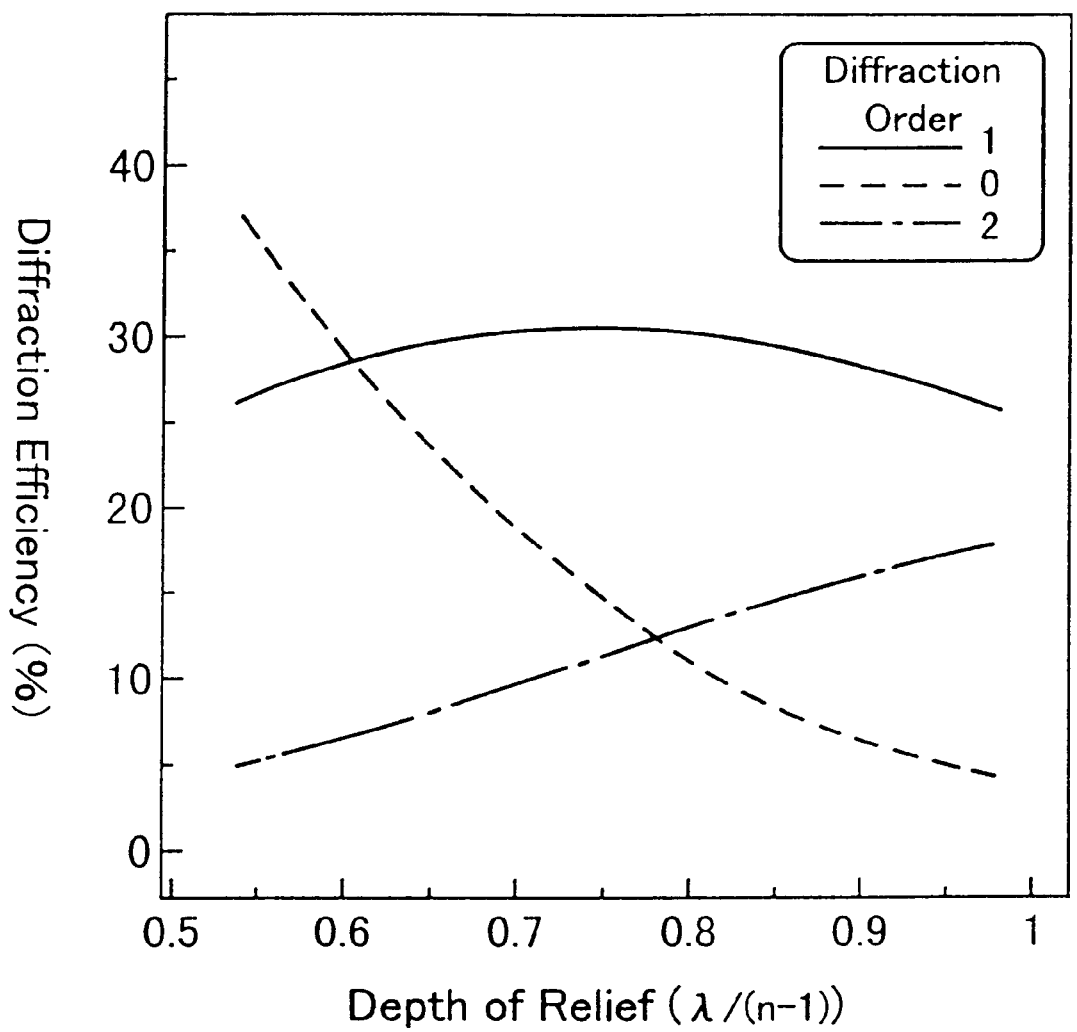
FIG. 6 a graph showing variation in diffraction efficiency when the coupling lens according to the first example of the present invention is designed with various relief depths.

FIG. 6 is a graph obtained by plotting calculation results of diffraction efficiency when a lens designed using the above-mentioned lens data is processed using a bit having a nose radius of 10 μm at its tip while being varied in relief depth with a relief function having an approximately isosceles triangular shape with its apex at a location corresponding to 50% in the same period as in the present example. In the graph, the horizontal axis indicates the depth of the relief function in a unit of λ/(n−1). As can be seen from this figure, a relief with an approximately isosceles triangular shape varies in diffraction efficiency gently with respect to the variation in depth of the relief. This means that a manufactured lens has less variation in diffraction efficiency even if strain or shrinkage occurs in molding the lens. Therefore, the relief also is desirable from a manufacturing viewpoint. In addition, the diffraction efficiency of first-order diffracted light is about 28 to 30% in the following range:

0.6<W(n−1)/λ<1.0.

Thus, it can be seen that the manufactured lens has a diffraction efficiency desirable for a lens used in a semiconductor laser module.

In the present example, the relief shape of the present invention was applied and the shape and diffraction efficiency were calculated based on the specific lens design data, thus showing the usefulness of the relief shape of the present invention. However, the relief shape of the present invention is not limited by the above-mentioned specific design data. Naturally, the same effects also can be obtained in the case of using other design data as long as the lens is one used for optical fiber coupling, which is provided with a temperature compensation effect by a diffraction lens designed using a resin material, or one with a specification equivalent thereto.

Based on the relief shape of the present invention, there is a possibility of improving the shape in order to increase the productivity, such as, for example, allowing an apex to have roundness. However, as it also is apparent from the description of the above-mentioned example, the relief shape of the present invention enables the diffraction efficiency as designed to be obtained even if the apex is rounded by processing. Therefore, the improvement in relief shape as described above is included in the idea of the present invention.

For the calculation of diffraction efficiency considering a nose radius of a bit for processing, a method of calculating diffraction efficiency by Yamagata (Yamagata et al.: "Efficiency Simulation for Diamond Turned Diffractive Lenses", Jpn. J. Appl. Phys., Vol. 37, No. 6B (1998)) was used.

SECOND EMBODIMENT

When a concentric diffraction lens is formed in a lens and intensity of light emitted from a module is adjusted by the diffraction efficiency of the diffraction lens, since an aperture is provided at the position of a focal spot corresponding to an order used for optical fiber coupling, lights with diffraction orders other than that are excluded by the aperture. However, some of lights with orders higher and lower by one order than that used for coupling pass through the aperture. In this case, it is desirable that a large part of unwanted light is distributed to higher diffraction orders (diffraction orders allowing a composite focal length to be short) than that used for optical fiber coupling. The reason is that since the lights with higher diffraction orders are diffused more greatly on an image plane where the aperture is positioned compared to lights with lower diffraction orders (diffraction orders allowing a composite focal length of a refractive lens and a diffraction lens to be long) than that used for optical fiber coupling, the quantity of lights with unnecessary orders passing through the aperture can be reduced.

SECOND EXAMPLE

Figure 7:
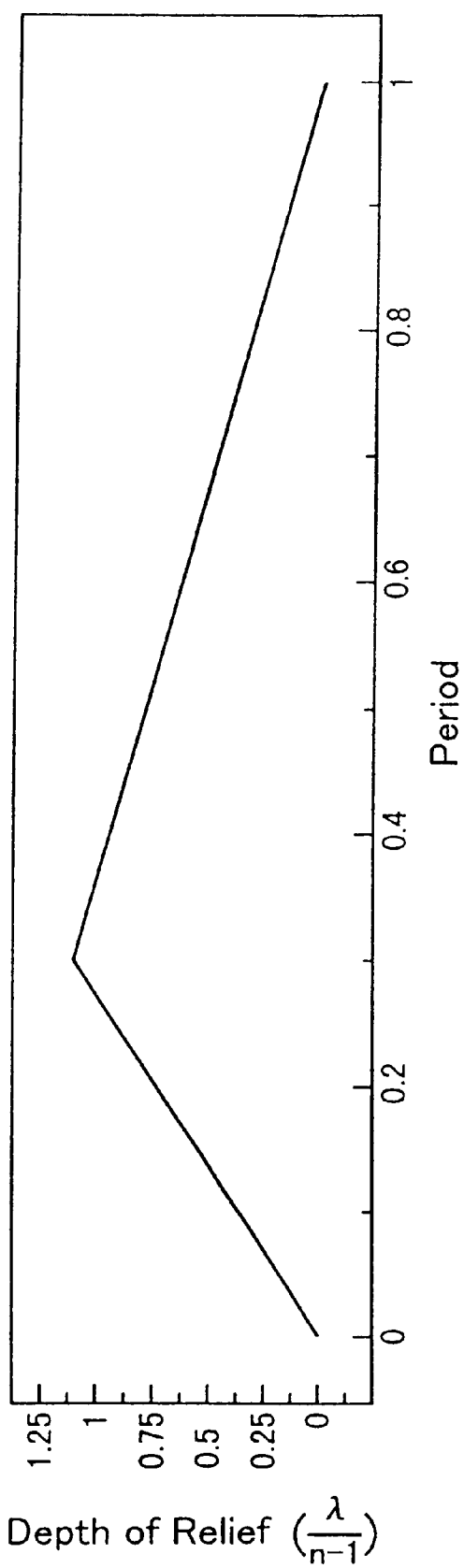
FIG. 7 is a graph showing a shape function of a relief of a coupling lens according to a second example of the present invention.

FIG. 7 shows a shape function of a relief of a lens for a laser module according to the present example. The depth of the relief in the vertical axis is indicated in a unit of $\lambda/(n-1)$.

The shape function of the relief according to the present example has a triangular wavy shape whose apex is at a location corresponding to 30% in a period, and the depth of the relief is $1.1 \times \lambda/(n-1)$.

Figure 8:
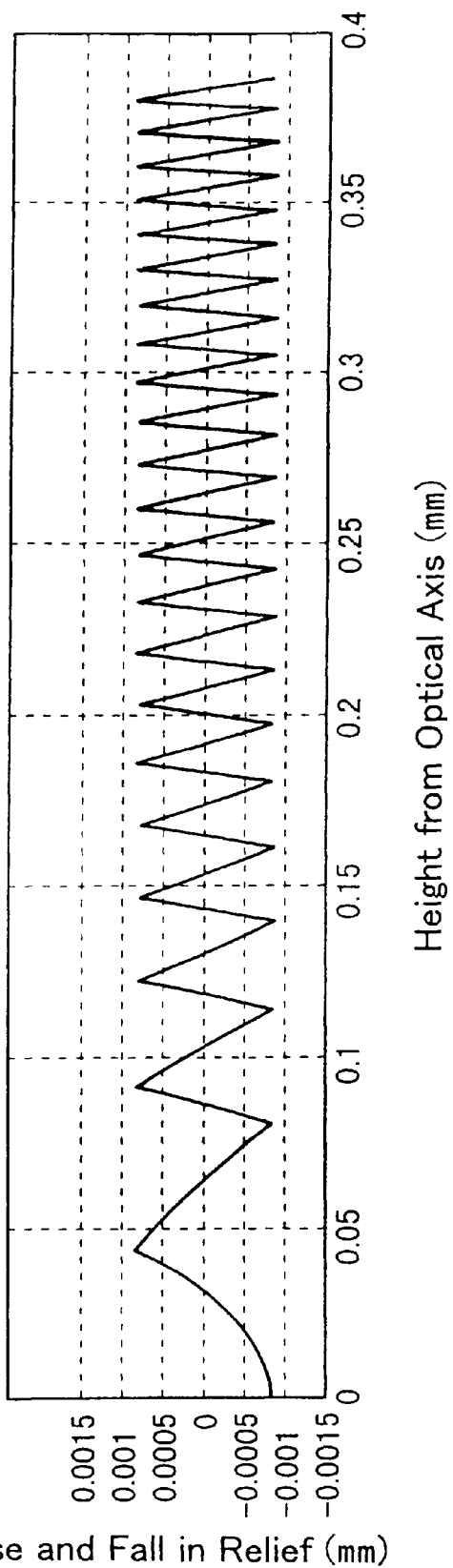
FIG. 8 is a graph showing a relief shape for processing the coupling lens according to the second example of the present invention.
Figure 9:
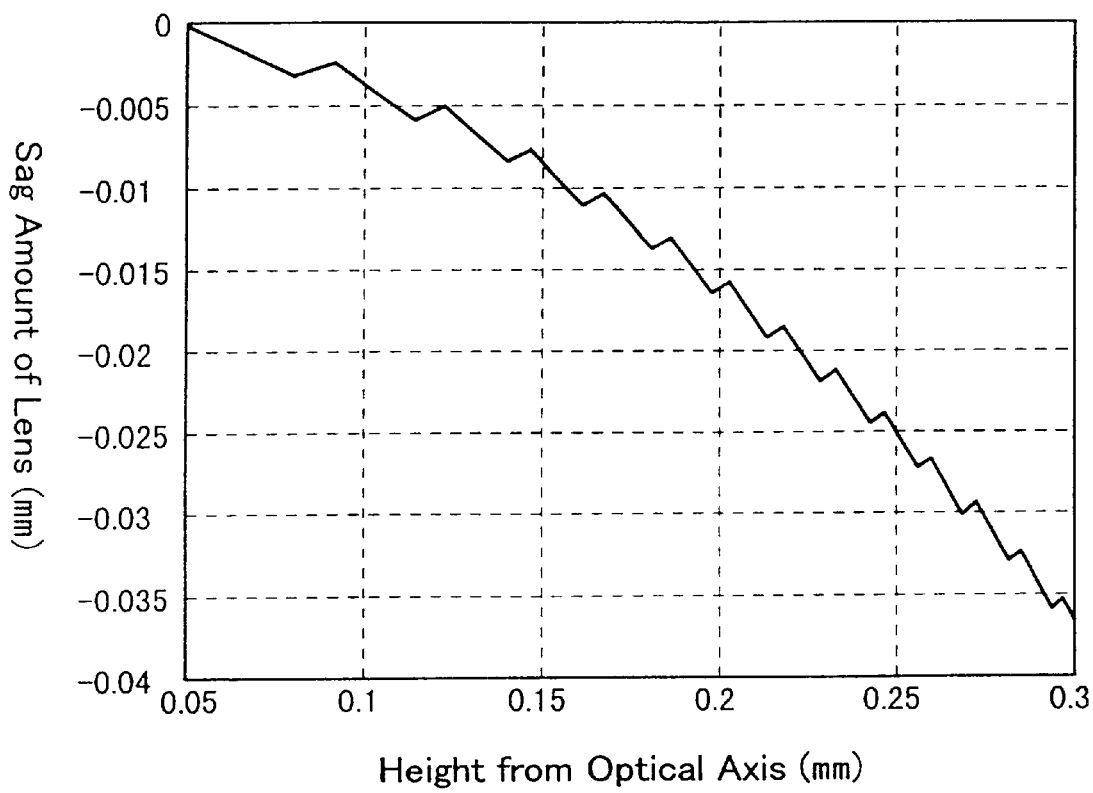
FIG. 9 is a graph showing a sag amount of a surface on which a diffraction lens is formed in the coupling lens according to the second example of the present invention.

With respect to the relief shown in FIG. 7, a shape of the relief for processing the lens and a sag amount of a surface on which a diffraction lens is integrated are shown in FIGS. 8 and 9 using the lens data indicated in Tables 1 and 2. In FIG. 8, the horizontal axis indicates height from an optical axis of the lens and the vertical axis indicates rise and fall in the relief with respect to an aspheric surface, both of which are indicated in units of mm.

FIG. 9 is a graph obtained by plotting a part of sag of a surface on which a diffraction lens is formed. In FIG. 9, the horizontal axis indicates a distance from an optical axis and the vertical axis indicates a sag amount of the lens. In the figure, the sag amount is negative, since the coordinate axes are set so that a fiber direction is positive in the optical system shown in FIG. 1.

The following Table 3 shows calculation results of diffraction efficiency of a lens as a whole, which has the relief shape of the present example, when the lens is processed using a bit with a nose radius of 10 μm.

TABLE 3

|  | Zero-Order | First-order | Second-order |
|---|---|---|---|
| Diffraction Efficiency | 5.3% | 37.0% | 18.8% |

As can be seen from Table 3, in the case of using a diffraction lens having the relief shape shown in the present example, light intensity distributed to zero-order diffracted light with a longer focal length than that of first-order diffracted light used for optical fiber coupling is low, and unwanted light is distributed to second-order diffracted light with a shorter focal length.

Figure 10:
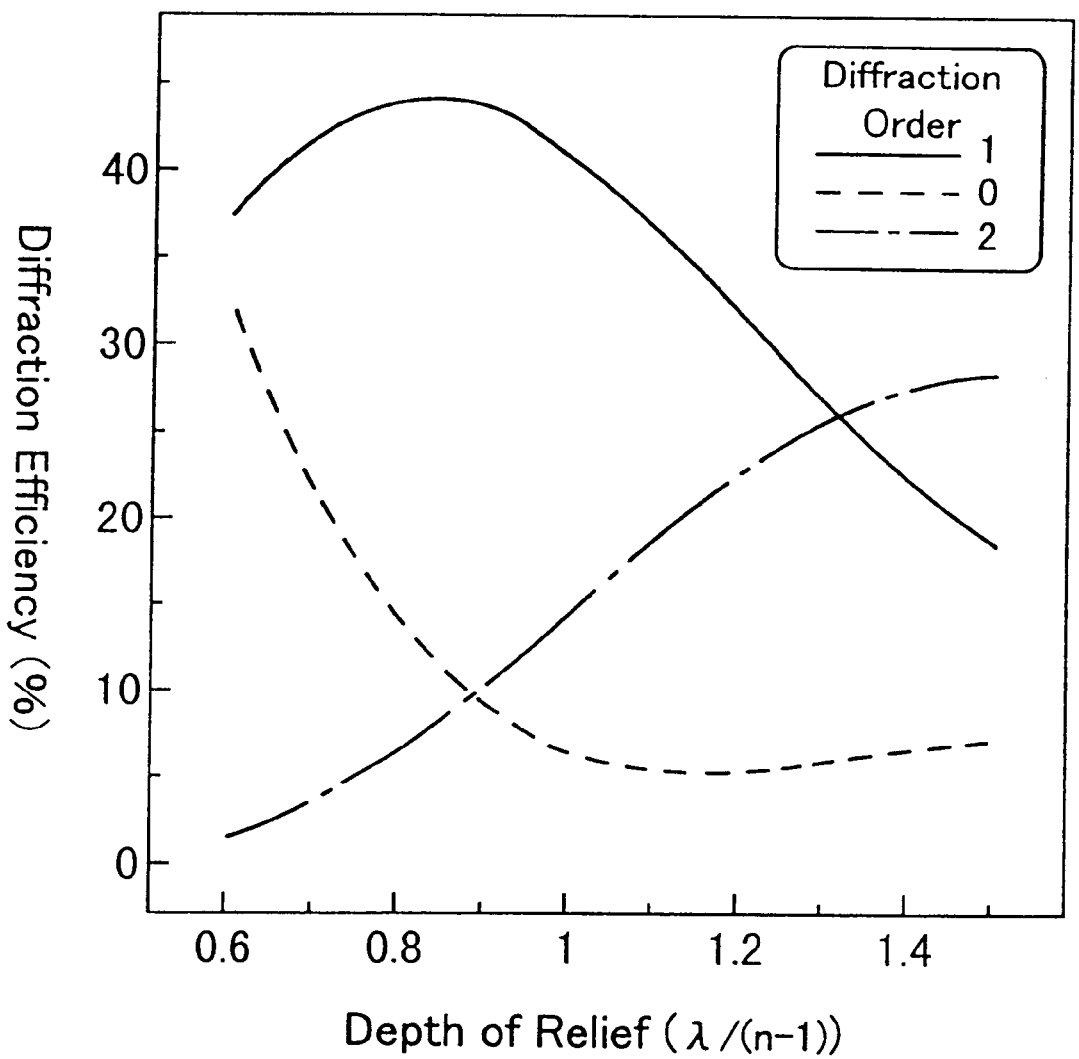
FIG. 10 is a graph showing variation in diffraction efficiency when the coupling lens according to the second example of the present invention is designed with various relief depths.

FIG. 10 is a graph obtained by plotting calculation results of diffraction efficiency with respect to respective diffraction orders when a lens designed using the aforementioned lens design data is processed using a bit having a nose radius of 10 μm at its tip while being varied in relief depth with a relief function having a triangular wavy shape with its apex at a location corresponding to 30% in a period as in the present example. In the graph, the horizontal axis indicates the depth of the relief in a unit of $\lambda/(n-1)$. From this graph, it can be seen that when the depth of the relief function is in the range of $$1.05 \leq W(n-1)/\lambda \leq 1.1,$$

the diffraction efficiency of first-order diffracted light used for coupling is allowed to be about 30 to 40% while the diffraction efficiency of the zero-order diffracted light is reduced to be below 7%. Furthermore, it can be seen that the lens has a design enabling unwanted light to be led to second-order diffracted light more than to zero-order diffracted light, thus having an optimum diffraction efficiency as a lens for a semiconductor laser module.

In the present example, the relief shape of the present invention was applied and the shape and diffraction efficiency were calculated based on the specific lens design data, thus showing the usefulness of the relief shape of the present invention. However, the relief shape of the present invention is not limited by the above-mentioned specific design data. Naturally, the same effects also can be obtained in the case of using other design data as long as the lens is one used for optical fiber coupling, which is provided with a temperature compensation effect by a diffraction lens designed using a resin material, or one with a specification equivalent thereto.

Based on the relief shape of the present invention, there is a possibility of improving the shape in order to increase the productivity, such as, for example, allowing an apex to have roundness. However, as it also is apparent from the description of the above-mentioned example, the relief shape of the present invention enables the diffraction efficiency as designed to be obtained even if the apex is rounded by processing. Therefore, the improvement in relief shape as described above is included in the idea of the present invention.

In the present example, the above description was directed to an example in the case where the relief has its apex at a location corresponding to 30%. However, the same effect as in the present example is obtained when the depth W of the relief function satisfies the following formula:

$$1.0 \leq W(n-1)/\lambda \leq 1.05$$

even if the apex is at a location corresponding to 30 to 40%. In other words, zero-order diffracted light can be reduced while the diffraction efficiency of first-order diffracted light is allowed to be 30 to 40%.

When the apex is at a location corresponding to a percentage higher than 40%, a diffraction efficiency of 40% cannot be obtained even if the depth of the relief is adjusted. Further, when the apex is at a location corresponding to a percentage lower than 30%, the range of the relief depth most suitable for the first-order diffracted light is narrowed, thus requiring severe processing accuracy and in addition, zero-order diffracted light is generated. Thus, these cases are not preferable.

THIRD EXAMPLE

Figure 11:
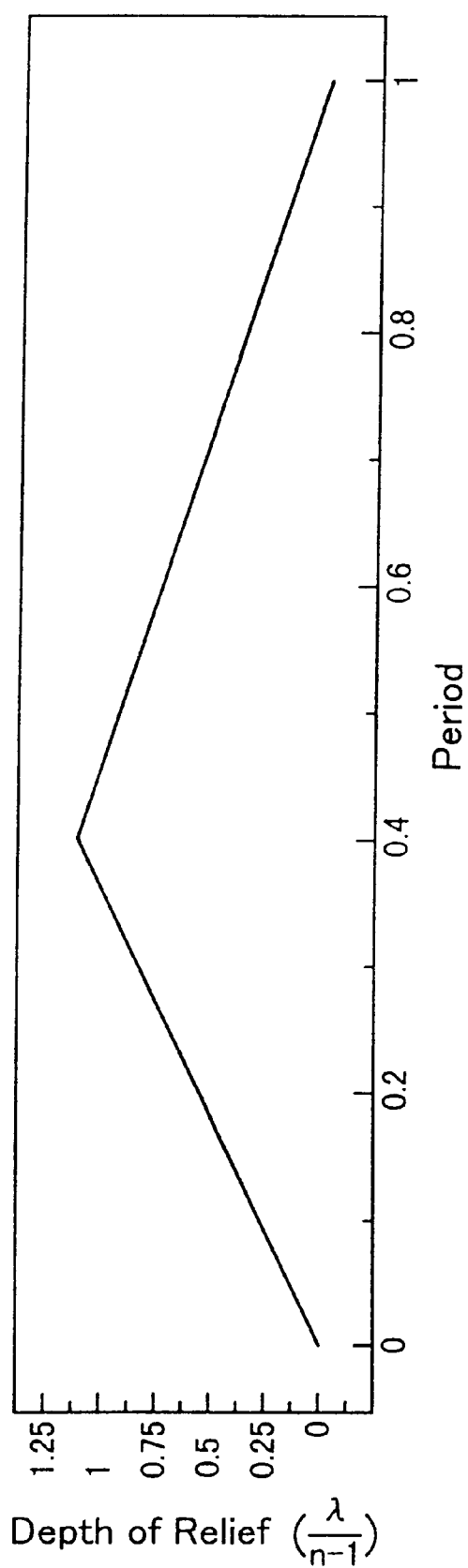
FIG. 11 is a graph showing a shape function of a relief of a coupling lens according to a third example of the present invention.

FIG. 11 shows a shape function of a relief of a lens for a laser module according to the present example. The depth of the relief in the vertical axis is indicated in a unit of $\lambda/(n-1)$. The shape function of the relief according to the present example has a triangular wavy shape and its apex at a location corresponding to 40% in a period, and the relief has a depth of $\lambda/(n-1)$.

With respect to the relief function of the present example shown in FIG. 11, a shape of the relief for processing the lens and a sag amount of a surface on which a diffraction lens was integrated were determined using the lens data shown in Tables 1 and 2, and then the diffraction efficiency of the lens as a whole in the case where the lens was processed using a bit with a nose radius of 10 µm was calculated. The calculation results are shown in Table 4.

TABLE 4

|  | Zero-Order | First-order | Second-order |
|---|---|---|---|
| Diffraction Efficiency | 4.7% | 33.2% | 18.0% |

Figure 12:
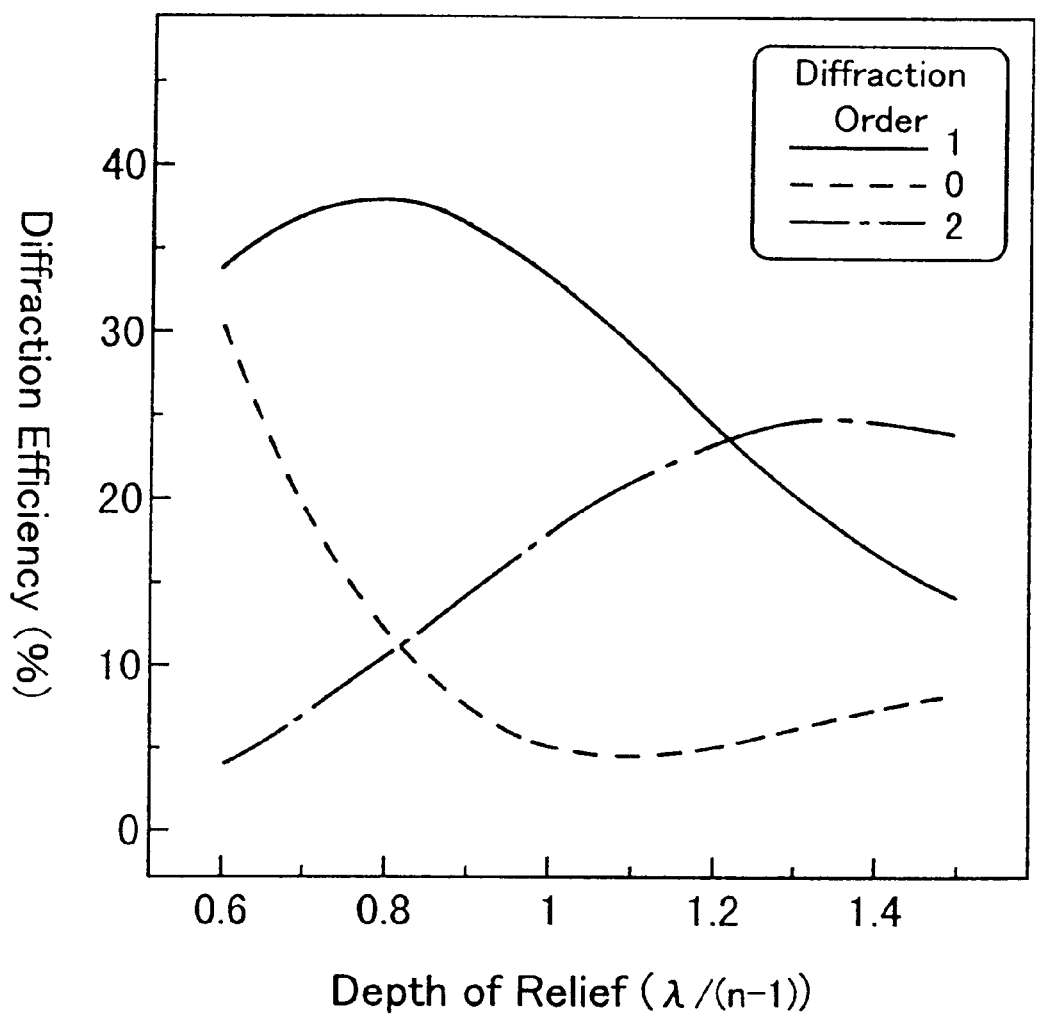
FIG. 12 is a graph showing variation in diffraction efficiency when the coupling lens according to the third example of the present invention is designed with various relief depths.

FIG. 12 is a graph obtained by plotting the calculation results of diffraction efficiency with respect to respective diffraction orders when a lens designed with various relief depths using a triangular wavy relief function having its apex at a location corresponding to 40% as indicated in the present example is processed using a bit with a nose radius of 10 µm. In the graph, the horizontal axis indicates the depth of the relief in a unit of $\lambda/(n-1)$. From FIG. 12, it can be seen that when the depth W of the relief function satisfies the following formula:

$$0.9 < W(n-1)/\lambda < 1.15,$$

the lens has a design enabling diffraction efficiency of first-order diffracted light to be 25% to 38%, diffraction efficiency of zero-order diffracted light to be 7% or less, and undesired light to be led to second-order diffracted light more than to zero-order diffracted light, thus having an optimum diffraction efficiency as a lens for a semiconductor laser module.

In the present example, the relief shape of the present invention was applied and the shape and diffraction efficiency were calculated based on the specific lens design data, thus showing the usefulness of the relief shape of the present invention. However, the relief shape of the present invention is not limited by the above-mentioned specific design data. Naturally, the same effects also can be obtained in the case of using other design data as long as the lens is one used for optical fiber coupling, which is provided with a temperature compensation effect by a diffraction lens designed using a resin material, or one with a specification equivalent thereto.

Based on the relief shape of the present invention, there is a possibility of improving the shape in order to increase the productivity, such as, for example, allowing an apex to have roundness. However, as it also is apparent from the description of the above-mentioned example, the relief shape of the present invention enables the diffraction efficiency as designed to be obtained even if the apex is rounded by processing. Therefore, the improvement in relief shape as described above is included in the idea of the present invention.

FOURTH EXAMPLE

Figure 13:
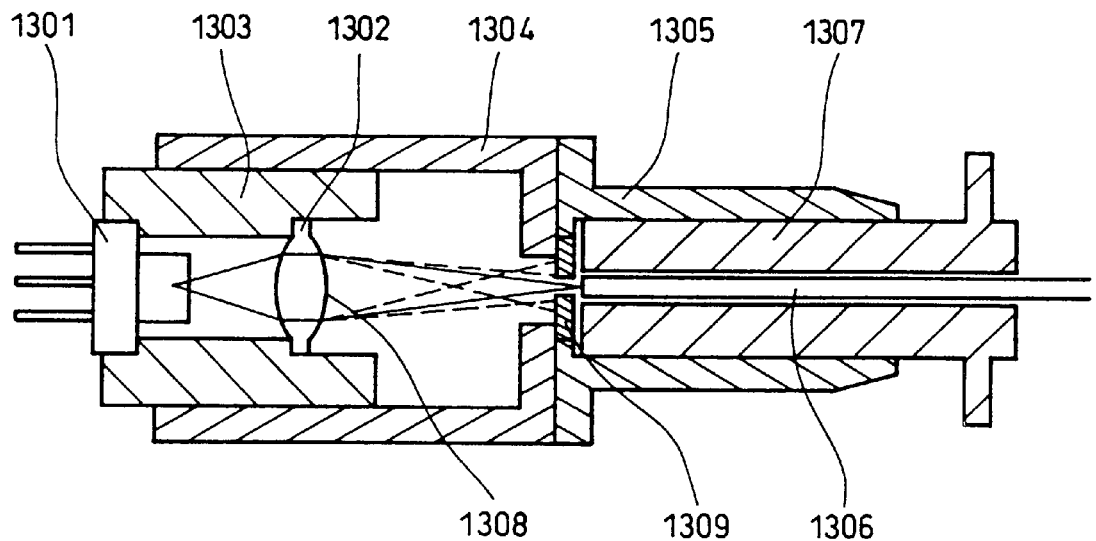
FIG. 13 shows a semiconductor laser module according to a fourth example of the present invention.
Figure 13:
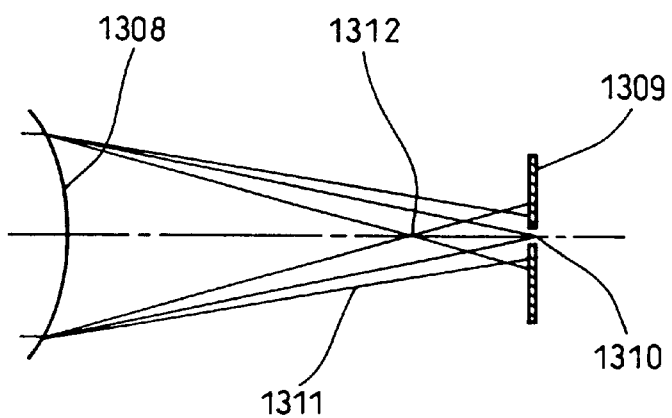

FIG. 13 shows a configuration of a semiconductor laser module using, as a coupling lens, a one-piece lens in which a diffraction member having the relief shown in the second example is integrated.

A semiconductor laser 1301 and a coupling lens 1302 of the present invention are fixed to front and rear end portions of a lens holder 1303 opposing each other. A connecting holder 1304 is fitted onto the peripheral surface of the lens holder 1303. To this connecting holder 1304, a ferrule holder 1305 is fixed, and a ferrule 1307 into which an optical fiber 1306 is inserted is fixed removably to the ferrule holder, 1305.

A beam of light emitted from the semiconductor laser 1301 enters the coupling lens 1302 of the present invention. A diffraction lens is formed on an outgoing-side plane 1308 of the coupling lens according to the present invention, and first-order diffracted light from the diffraction lens passes through an aperture 1309 to form an image on an incident end face of the optical fiber 1306. FIG. 13(B) is an enlarged schematic view of the part from the outgoing-side plane 1308 of the lens to the aperture 1309. The aperture 1309 is provided at an imaging position 1310 of the first-order diffracted light. Zero-order diffracted light 1311 forms an image behind the aperture 1309 and second-order diffracted light 1312 forms an image before reaching the aperture. In this case, the second-order diffracted light 1312 is diffused on the aperture 1309 more than the zero-order diffracted light 1311. Therefore, the zero-order diffracted light 1311 passes through the aperture more easily compared to the second-order diffracted light 1312. In the present example, a lens generating little zero-order diffracted light 1311 is used and therefore unwanted light leaking out from the module can be reduced.

THIRD EMBODIMENT

When a one-piece temperature compensated resin lens in which a diffraction member is integrated is used as a coupling lens, lights with unnecessary diffraction orders are intercepted by an aperture. In this case, when the lights with unnecessary diffraction orders and light with a diffraction order used for optical fiber coupling form images with different image heights, the assembly accuracy and processing accuracy of the aperture can be relaxed, thus reducing the manufacturing cost of the module.

FIFTH EXAMPLE

Figure 14:
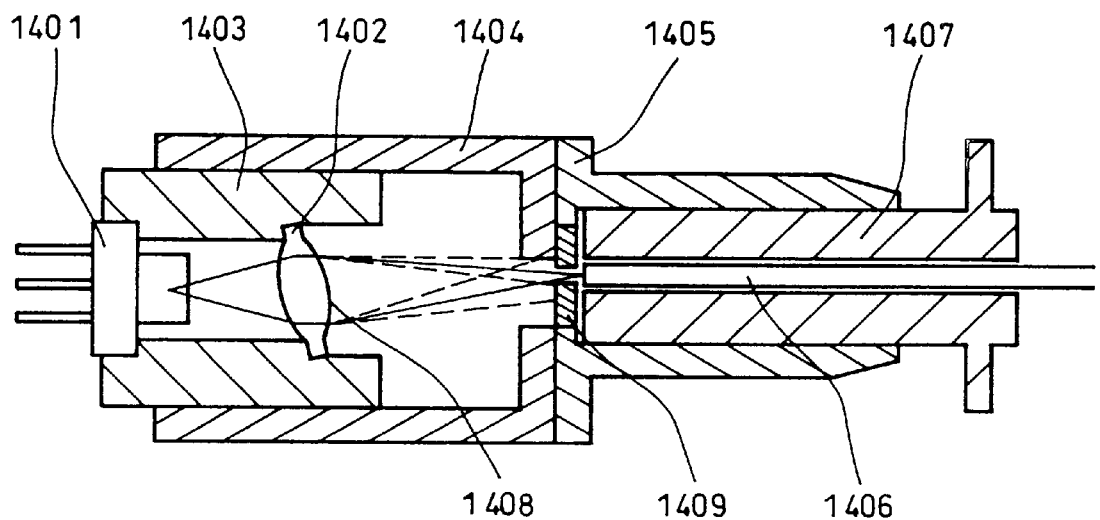
FIG. 14 is a structural view of a semiconductor laser module according to a fifth example of the present invention.

FIG. 14 is a schematic structural view of a laser module of the present example.

A semiconductor laser 1401 and a coupling lens 1402 of the present invention are fixed to front and rear end portions of a lens holder 1403 opposing each other. In the lens holder 1403, surfaces to which the lens is fixed are processed so that the coupling lens 1402 is attached having a tilt with respect to an optical axis. A connecting holder 1404 is fitted onto the peripheral surface of the lens holder 1403. To this connecting holder 1404, a ferrule holder 1405 is fixed, and a ferrule 1407 into which an optical fiber 1406 is inserted is fixed removably to the ferrule holder 1405.

A beam of light emitted from the semiconductor laser 1401 enters the coupling lens 1402 of the present invention. A diffraction lens is formed on an outgoing-side plane 1408 of the coupling lens according to the present invention, and first-order diffracted light from the diffraction lens passes through an aperture 1409 to form an image on an incident end face of the optical fiber 1406. In this case, since the coupling lens 1402 is fixed so as to be tilted with respect to the optical axis, the beam of light emitted from the semiconductor laser source becomes off-axis light with respect to the coupling lens. Therefore, due to the difference in composite focal length of the lens, respective lights with different diffraction orders have different focal planes on which images are formed and different image heights. Consequently, the processing accuracy and assembly accuracy of the aperture 1408 provided for intercepting unwanted light can be relaxed considerably. Furthermore, the aperture can be omitted depending on the positions of spots of diffracted lights with respective orders, thus reducing the cost of the module as a whole.

SIXTH EXAMPLE

Figure 15:
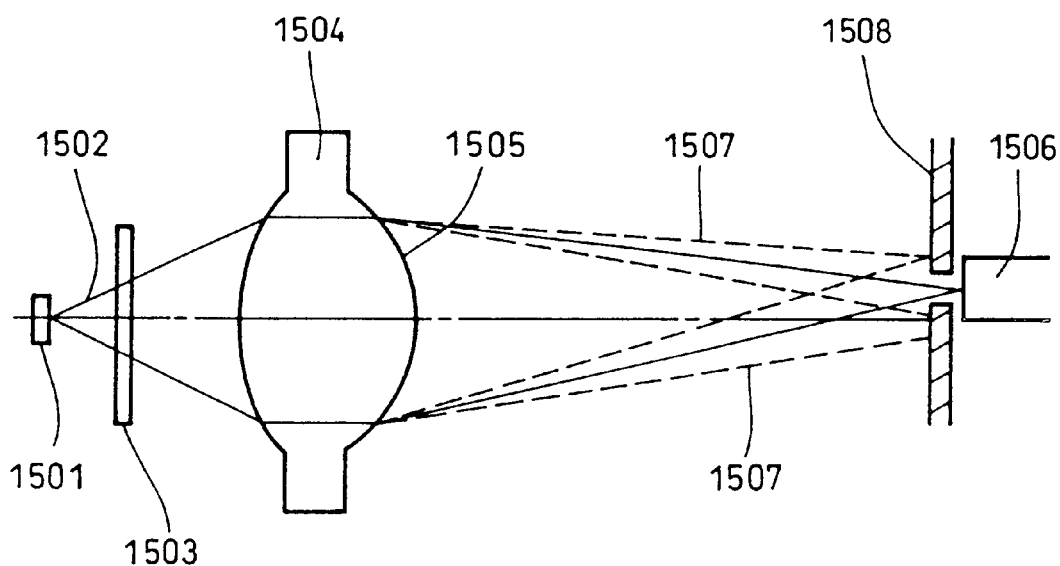
FIG. 15 shows a coupling lens according to a sixth example of present invention.
Figure 15:
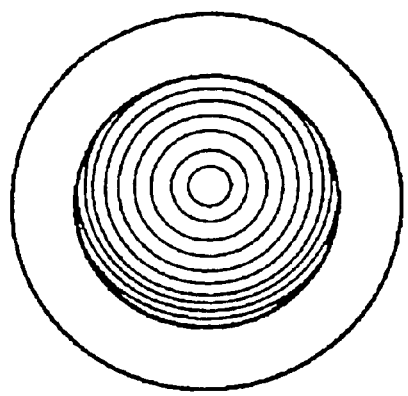

FIG. 15 is a schematic diagram showing optical paths of a coupling lens of the present example.

Light 1502 emitted from a laser 1501 passes through a window member 1503 of the laser and then enters a coupling lens 1504 of the present invention. On an outgoing-side plane 1505 of the coupling lens 1504 of the present invention, a diffraction lens formed of concentric zones is formed. FIG. 15(B) shows a front view of the outgoing-side plane. The center of the zones of this diffraction lens deviates with respect to an axis of rotational symmetry of the lens. In this case, the focal position of first-order diffracted light from the diffraction lens and the focal positions of second-order and zero-order diffracted lights from the diffraction lens are different both in position of image plane and image height. The first-order diffracted light from the diffraction lens is focused on the end face of an optical fiber 1506 to be coupled. Both zero-order and second-order diffracted lights 1507 are intercepted by an aperture 1508 provided in front of the optical fiber. In this case, however, imaging positions (image heights) of the lights with the respective diffraction orders are different, thus relaxing the processing accuracy and assembly accuracy of the aperture.

SEVENTH EXAMPLE

Figure 16:
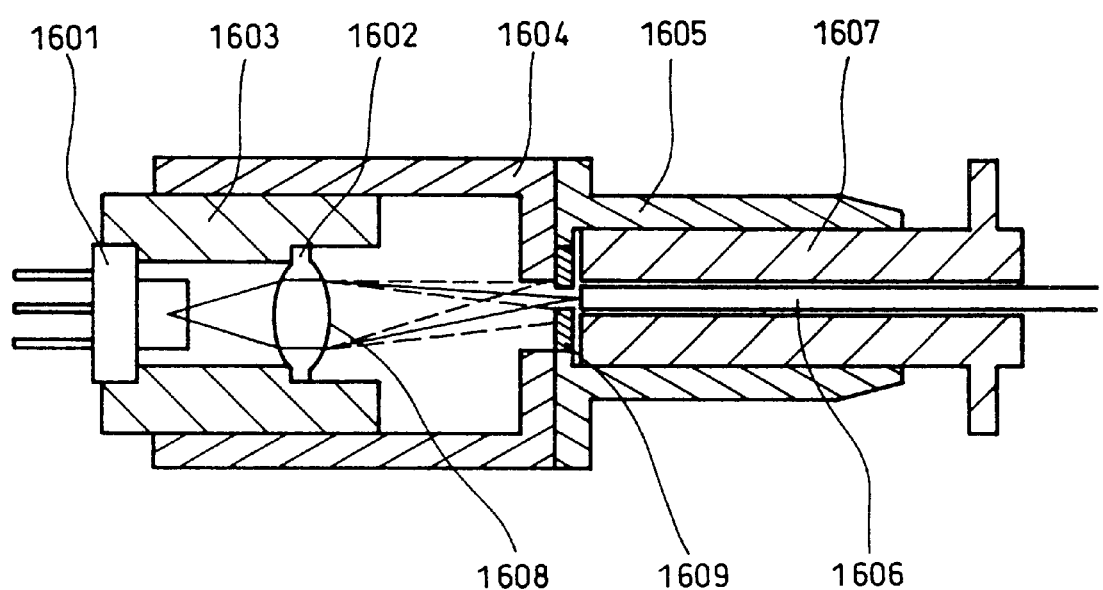
FIG. 16 is a structural view of a semiconductor laser module according to a seventh example of the present invention.

FIG. 16 is a schematic structural view of a laser module of the present example.

A semiconductor laser 1601 and a coupling lens 1602 of the present invention are fixed to front and rear end portions of a lens holder 1603 opposing each other. In this case, the lens described in the sixth example is used as the coupling lens 1602. A connecting holder 1604 is fitted onto the peripheral surface of the lens holder 1603. To this connecting holder 1604, a ferrule holder 1605 is fixed, and a ferrule 1607 into which an optical fiber 1606 is inserted is fixed removably to the ferrule holder 1605. In this case, the ferrule holder 1605 is attached so as to be uncentered with respect to the semiconductor laser 1601 so that the incident end face of the optical fiber 1606 is positioned at a focal position of first-order diffracted light from the coupling lens 1602.

A beam of light emitted from the semiconductor laser 1601 enters the coupling lens 1602 of the present invention. On an outgoing-side plane 1608 of the coupling lens according to the present invention, a diffraction lens is formed, and first-order diffracted light from the diffraction lens passes through an aperture 1609 and forms an image on the incident end face of the optical fiber 1606.

In the semiconductor laser module using the lens of the present example, the imaging positions of diffracted lights can be varied without attaching the lens with a tilt, thus simplifying the assembly of the module and reducing its manufacturing cost.

FOURTH EMBODIMENT

When a glass coupling lens is used, it is not required to correct variation in focal position due to variation in temperature. Therefore, by forming a diffraction grating on a surface of the lens, the intensity of light emitted from a module can be adjusted.

EIGHTH EXAMPLE

Figure 17:
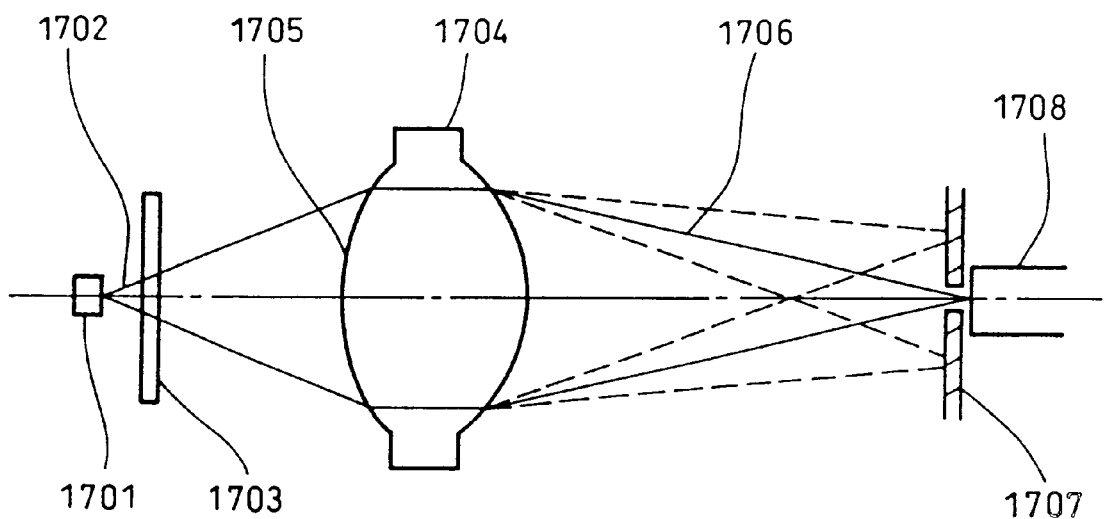
FIG. 17 shows a coupling lens according to an eighth example of the present invention.
Figure 17:
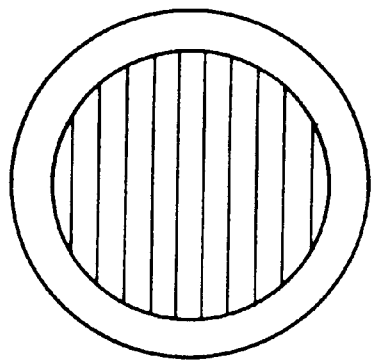

FIG. 17(A) is a diagram showing a cross section and optical paths of a coupling lens according to the present example. A beam 1702 emitted from a laser 1701 as a light source passes through a window member 1703 of the laser and enters a coupling lens 1704 of the present invention. On an incident plane 1705 of the coupling lens 1704 of the present invention, a diffraction grating formed of approximately linear grooves is formed. FIG. 17(B) shows a front view of the lens seen from the incident plane 1705 of the lens. Suppose the diffraction efficiency of the diffraction grating with respect to zero-order diffracted light is selected suitably so that output power of the module is within a safety standard and the diffraction grating formed on a surface of the lens has a sectional shape most suitable for achieving the above-mentioned diffraction efficiency. In this case, light entering the coupling lens 1704 is diffracted by the diffraction grating formed on the incident plane 1705 of the lens. Zero-order diffracted light 1706 passes through an aperture 1707 and forms an image on an end face of an optical fiber 1708. Lights with diffraction orders other than that are intercepted by the aperture 1707.

NINTH EXAMPLE

Figure 18:
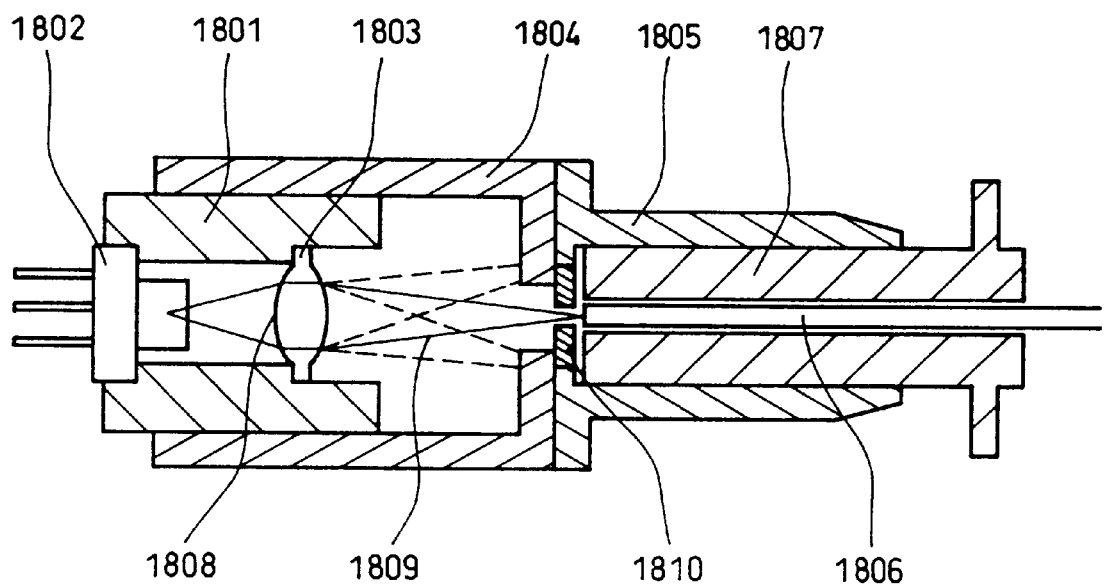
FIG. 18 is a structural view of a semiconductor laser module according to a ninth example of the present invention.

FIG. 18 shows a structural view of a semiconductor laser module of the present example.

A semiconductor laser 1802 is inserted into and fixed to a lens holder 1801 on its rear end side. On the other hand, a coupling lens 1803 described in the eighth example is fixed to the front end portion of the lens holder 1801. A connecting holder 1804 is fitted onto the peripheral surface of the lens holder 1801. Further, a ferrule holder 1805 is fixed to the connecting holder 1804 and a ferrule 1807 into which an optical fiber 1806 is inserted is fixed removably to the ferrule holder 1805. A beam of light emitted from the semiconductor laser 1802 enters the coupling lens 1803. On the incident plane side 1808 of the coupling lens 1803, a diffraction grating is formed, thus generating diffracted light.

In this case, zero-order diffracted light 1809 is focused on the end face of the optical fiber 1806 and is coupled to the fiber. Diffracted lights with other orders are intercepted by an aperture 1810 provided in front of the optical fiber and do not leak out from the module. Furthermore, when the diffraction grating processed on the coupling lens 1803 has a sufficiently small pitch, a large diffraction angle can be obtained. Thus, the aperture 1810 may be omitted.

In the semiconductor laser module of the present example, the intensity of light emitted from the module can be suppressed within the safety standard without further providing an optical attenuation member such as an attenuation film, a polarizing plate, or the like, or using a control circuit for stopping emission when the optical fiber comes off. As a result, an inexpensive laser module can be provided.

FIFTH EMBODIMENT

The upper limit of the safety standard of output power of a laser module is −4.9 dbm (the ANSI Standard) and the lower limit of the output power required for optical fiber communication is −10 dbm. Therefore, in designing a laser module, its output power must be adjusted within the above-mentioned range. Losses in quantity of light from a laser to an optical fiber include: losses at the incidence on a coupling lens caused by eclipse due to a small NA on the incident side of a coupling lens with respect to a divergence angle of a semiconductor laser, Fresnel loss at the lens surface, or the like; and a loss due to coupling efficiency between an outgoing beam of light from the lens and an optical fiber. When NAs of the coupling lens on the laser side and on the fiber side are about 0.2 and about 0.15, a loss at the incidence on the lens of about 45 to 55% and a loss upon fiber coupling of about 20% to 30% are expected.

In addition, a laser suitable for high-speed communication has an output power of about 0 dbm. Therefore, the laser module is designed so that its output power falls within the standard considering the above-mentioned losses by adjusting the diffraction efficiency of a diffraction lens.

When consideration is given to the above-mentioned conditions, the diffraction efficiency η of diffracted light used for optical fiber coupling satisfies the following formula:

$$30\% \leq \eta \leq 37\%.$$

However, depending on the variation of expected losses with variation in specification of the lens and the selection of output power of the laser used as a light source, the preferable diffraction efficiency η is distributed in the following range:

$$25\% \leq \eta \leq 40\%.$$

Table 5 shows calculation results of amplitude of a relief required for obtaining the above-mentioned diffraction efficiency as diffraction efficiency of first-order diffracted light in the case where the location of the apex of the relief is in the range of 25% to 50% of a relief period when a wavelength is 790 nm, a material has a refractive index of 1.523306, an average pitch of zones is 40 μm, and a processing bit has a nose radius R of 10 μm at its tip. The amplitude is indicated in a unit of λ/(n−1). In this case, λ/(n−1) is 1.509633 μm. Blanks in the table indicate that the diffraction efficiency cannot be obtained even if the depth of the relief is adjusted.

TABLE 5

|  |  | Diffraction Efficiency (%) | | | | |
| --- | --- | --- | --- | --- | --- | --- |
|  |  | 25 | 30 | 33 | 37 | 40 |
| Location | 0.250 | 1.27 | 1.24 | 1.21 | 1.17 | 1.14 |
| of | 0.275 | 1.25 | 1.2 | 1.17 | 1.13 | 1.1 |
| Apex | 0.300 | 1.21 | 1.16 | 1.13 | 1.08 | 1.05 |
|  | 0.325 | 1.18 | 1.12 | 1.09 | 1.04 | 1.00 |
|  | 0.350 | 1.14 | 1.08 | 1.04 | 0.99 | 0.94 |
|  | 0.375 | 1.10 | 1.04 | 0.99 | 0.95 | 0.87 |
|  | 0.400 | 1.06 | 0.99 | 0.94 | 0.86 | 0.74 |
|  | 0.425 | 1.02 | 0.94 | 0.88 | 0.72 |  |
|  | 0.450 | 0.97 | 0.88 | 0.81 |  |  |
|  | 0.475 | 0.93 | 0.82 | 0.70 |  |  |
|  | 0.500 | 0.87 | 0.68 |  |  |  |

From the table, it can be seen that a diffraction efficiency between 25% and 40% can be obtained when the relief shape is designed so as to satisfy the following formula:

$$-2.5X+1.75 \leq W(n-1)/\lambda \leq -1.6X+1.71.$$

Similarly, a diffraction efficiency between 30% and 37% can be obtained when the relief shape is designed so as to satisfy the following formula:

$$-2.4X+1.76 \leq W(n-1)/\lambda \leq -1.94X+1.77.$$

When processing conditions or an average pitch in the lens is varied, the above-mentioned optimum conditions vary slightly. When the amount of the variation is expected to be 5%, the amplitude W of a relief required for obtaining the diffraction efficiency between 25% and 40% satisfies the following formula:

$$-2.5X+1.66 \leq W(n-1)/\lambda \leq -1.6X+1.8$$

and similarly, the condition for obtaining the diffraction efficiency between 30% and 37% is expressed by the following formula:

$$-2.4X+1.67 \leq W(n-1)/\lambda \leq -1.94X+1.86.$$

In the above-mentioned design conditions, when the location X of the apex of a relief is between 0.3 (30%) and 0.4 (40%), it is possible to lessen zero-order diffracted light. Therefore, in constructing the module, it is possible to further reduce light leaking out from an aperture.

The coupling lens of the present embodiment can be used by being incorporated in a semiconductor laser module having the same configuration as that of the above-mentioned example 4, 5, or the like.

SIXTH EMBODIMENT

Using a pair of lenses of a single lens and a diffraction lens as a coupling lens is advantageous in that a single lens that has been used conventionally can be used without being modified.

TENTH EXAMPLE

Figure 19:
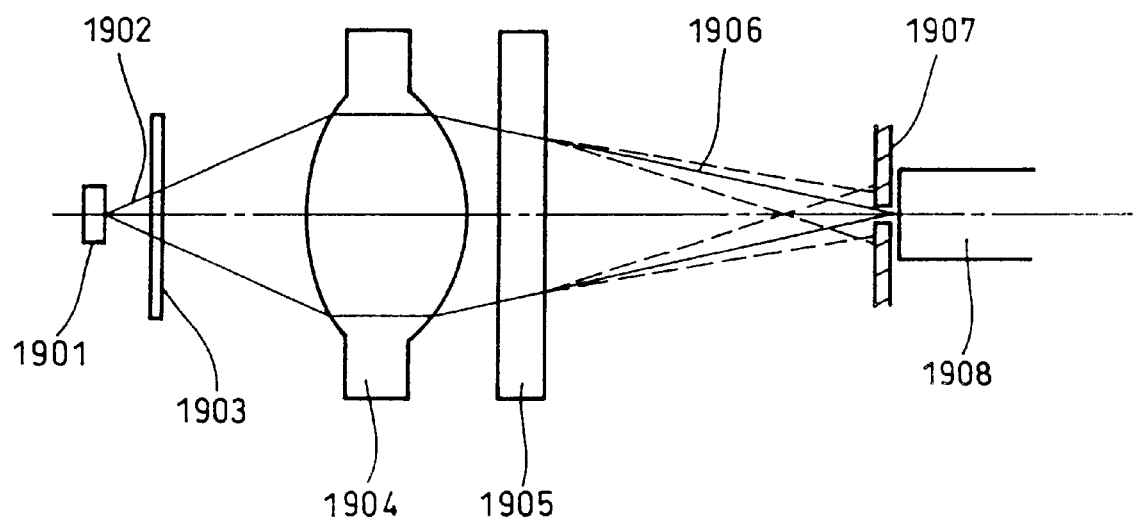
FIG. 19 shows a coupling lens according to a tenth example of the present invention.
Figure 19:
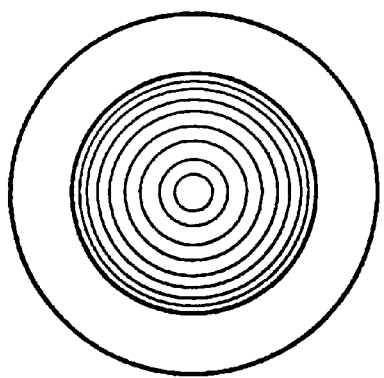

FIG. 19 is a structural view of a coupling lens of the present invention.

A beam of light 1902 emitted from a light source 1901 passes through a window member 1903 and then enters a refractive lens 1904. The refractive lens 1904 allows the incident light of a divergent beam of light to go out as a convergent beam of light. Then the outgoing light from the refractive lens 1904 enters a diffraction lens 1905. In the diffraction lens 1905, concentric zones are formed as shown in FIG. 19(B), and the diffraction lens functions as a positive lens.

The diffraction lens is designed so that the variation in focal position due to variation in temperature in the refractive lens 1904 is corrected with respect to first-order diffracted light from the diffraction lens 1905. For this purpose, if a composite focal length of the pair of lenses formed of the refractive lens 1904 and the diffraction lens 1905 with respect to first-order diffracted light is f and the focal length of first-order diffracted light from the diffraction lens 1905 is fd, the diffraction lens can be designed to satisfy the following formula:

$$2 < fd/f < 5.$$

It is necessary to determine diffraction efficiency of the diffraction lens considering the output power of a semiconductor laser source used as the light source, a numerical aperture of the lens, the coupling efficiency of a fiber, the lower limit of a fiber output standard, and the upper limit of a safety standard of output power from the module. If the refractive lens 1904 has a numerical aperture of 0.2 to 0.4 on the light source side and a numerical aperture of about 0.1 to 0.2 on the fiber side and the semiconductor laser as the light source has an output power of about 0 to 2 dbm, the diffraction efficiency of first-order diffracted light from the diffraction lens 1905 can be determined suitably within a range between 25 and 40% (more preferably, between 30 and 37%).

First-order diffracted light 1906 from the diffraction lens 1905 passes through an aperture 1907 and forms an image on an end face of an optical fiber 1908. Diffracted lights (indicated with broken lines in the figure) with orders other than that form images on positions different from the aperture 1907. Therefore, beams of light spread on the surface of the aperture 1907 and are intercepted by the aperture 1907.

Figure 20:
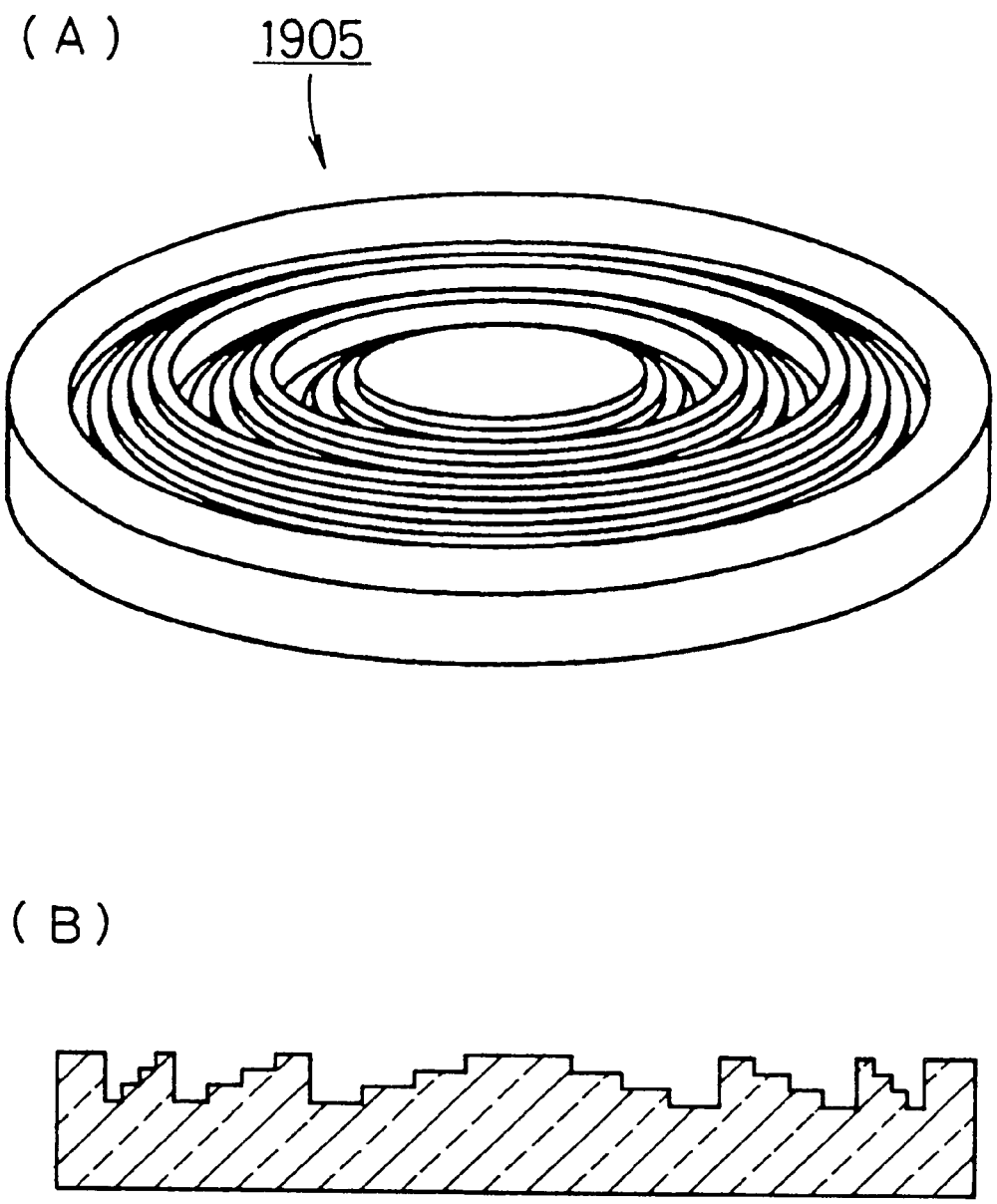
FIG. 20 shows the diffraction lens according to the tenth example of the present invention.

FIG. 20(A) is a perspective view of the diffraction lens 1905 and FIG. 20(B) is a sectional view of the diffraction lens in a plane including an optical axis.

When a diffraction lens is formed on a surface, it can be manufactured by photolithography. A diffraction lens manufactured by this method is characterized by having step-wise zones as shown in FIG. 20(B). The figure shows a diffraction lens formed of four steps. However, it is possible to adjust diffraction efficiency within an optimum range by adjusting the number of the steps and the sectional shape of the steps.

ELEVENTH EXAMPLE

Figure 21:
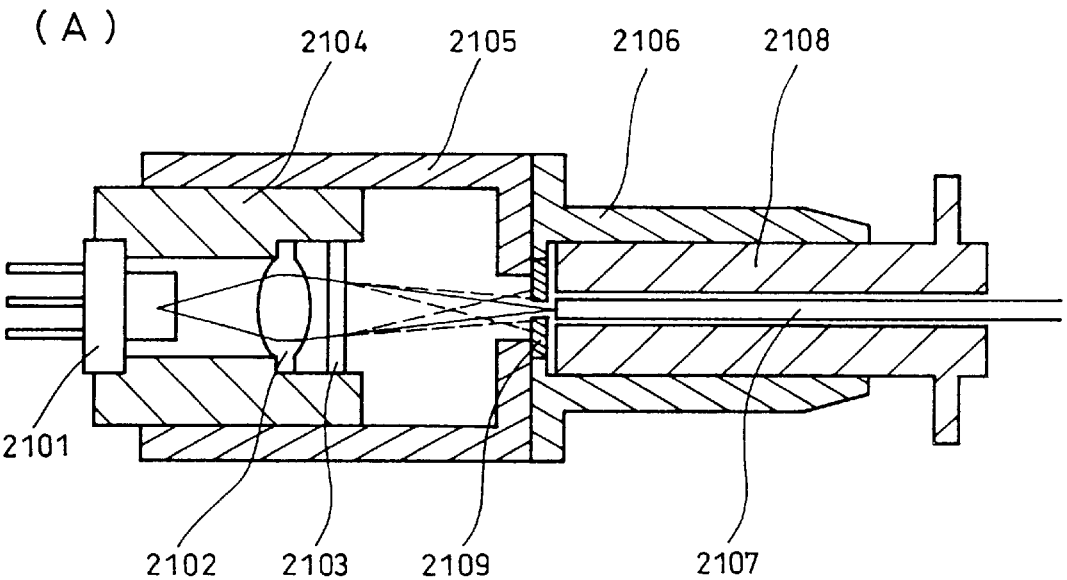
FIG. 21 shows a semiconductor laser module according to an eleventh or twelfth example of the present invention.
Figure 21:
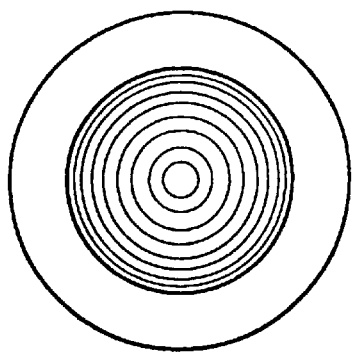
Figure 21:
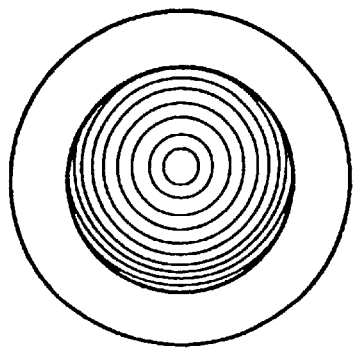

FIG. 21(A) is a schematic structural view of a semiconductor laser module of the present example.

A semiconductor laser 2101 and a coupling lens formed of a pair of lenses including a refractive lens 2102 and a diffraction lens 2103 are fixed to front and rear portions of a lens holder 2104 opposing each other. The diffraction lens 2103 is formed of concentric zones (see FIG. 20) having their center on an optical axis as shown in FIG. 21(B). A connecting holder 2105 is fitted onto the peripheral surface of the lens holder 2104. A ferrule holder 2106 is fixed to this connecting holder 2105 and a ferrule 2108 into which an optical fiber 2107 is inserted is fixed removably to the ferrule holder 2106.

A beam of light emitted from the semiconductor laser 2101 enters the refractive lens 2102. An outgoing beam of light from the refractive lens enters the diffraction lens 2103 and is separated into diffracted lights with a plurality of orders by the diffraction lens. First-order diffracted light from the diffraction lens passes through an aperture 2109 and is coupled to an end face of the optical fiber 2107. The diffracted lights with the other orders from the diffraction lens have different focal lengths and thus are focused on the optical axis at positions different from that of the first-order diffracted light. Therefore, these beams of light spread over the surface of the aperture and are intercepted by the aperture.

TWELFTH EXAMPLE

FIG. 21(C) is a front view of a diffraction lens in a semiconductor laser module of the present example.

Zones of the diffraction lens are processed to be uncentered with respect to an optical axis.

When this diffraction lens is used as a substitute for the diffraction lens 2103 in the semiconductor laser module shown in the eleventh example, the following effect is obtained.

That is, the focal positions of lights with respective orders from the diffraction lens vary not only in a direction of the optical axis but also in a direction perpendicular to the optical axis. Therefore, the interception by the aperture becomes easy, and the processing accuracy and assembly accuracy of the aperture can be relaxed.

SEVENTH EMBODIMENT

When a conventional glass coupling lens is used, it is not necessary to correct the variation in focal position due to variation in temperature. Therefore, a diffraction grating is positioned in an optical path between a semiconductor laser and an optical fiber and thus the intensity of light emitted from a module can be adjusted.

THIRTEENTH EXAMPLE

Figure 22:
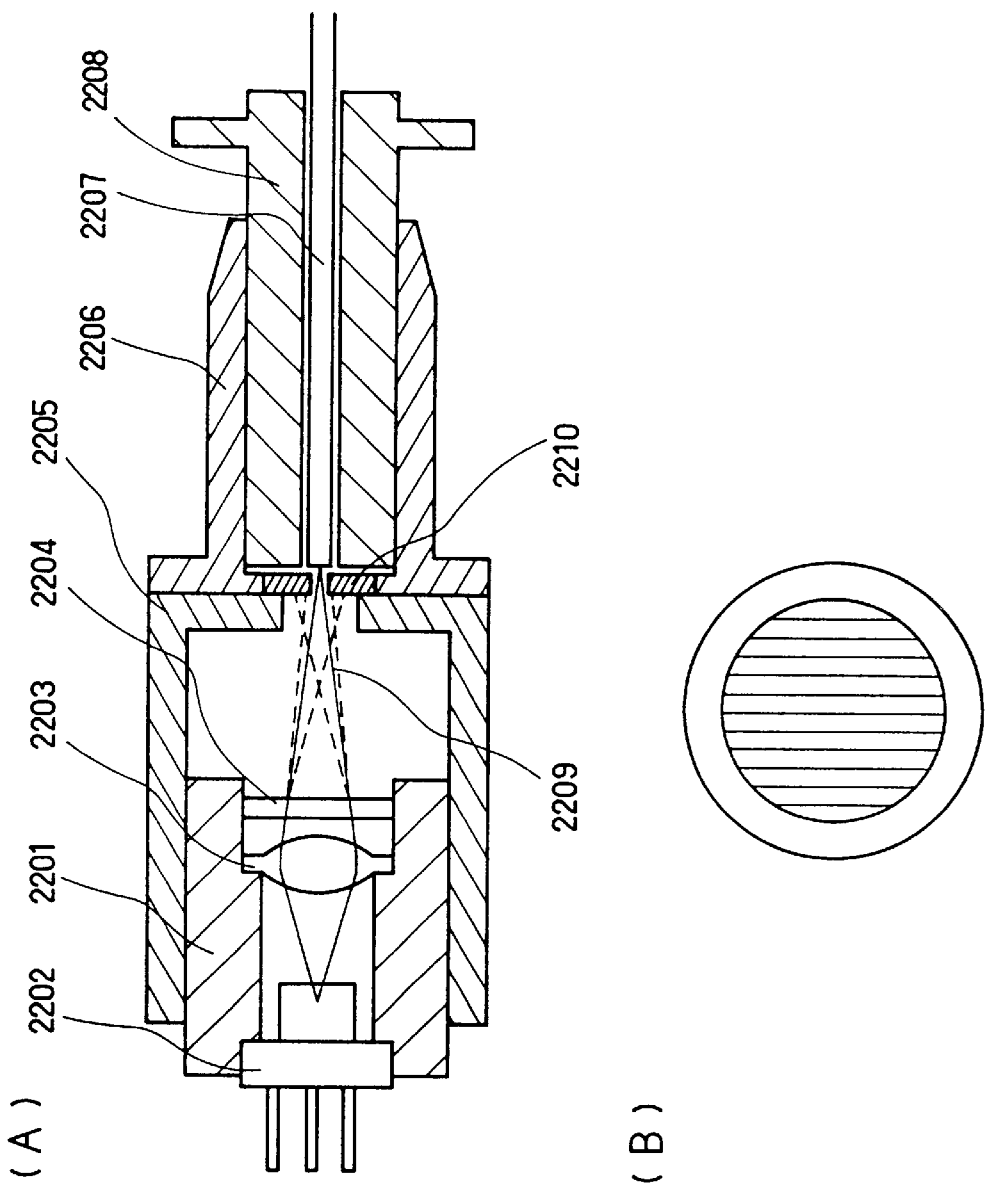
FIG. 22 shows a semiconductor laser module according to a thirteenth example of the present invention.
Figure 23:
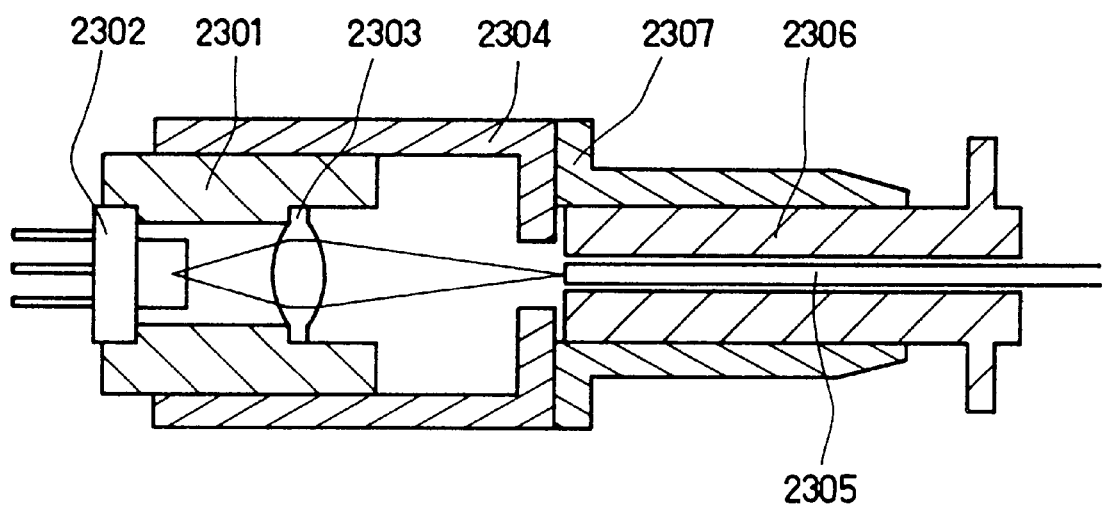
FIG. 23 is a structural view of a conventional semiconductor laser module.

FIG. 22(A) shows a structural view of a semiconductor laser module of the present example.

A semiconductor laser 2202 is inserted into and fixed to a lens holder 2201 on its rear end side. On the other hand, a coupling lens 2203 and a diffraction grating 2204 are fixed to a front end portion of the lens holder 2201. The diffraction grating 2204 is formed of linear grooves as shown in the front view in FIG. 22(B). A connecting holder 2205 is fitted onto the peripheral surface of the lens holder 2201 for the coupling lens. Furthermore, to this connecting holder 2205, a ferrule holder 2206 is fixed and a ferrule 2208 into which an optical fiber 2207 is inserted is fixed removably to the ferrule holder 2206. A beam of light emitted from the semiconductor laser 2202 enters the coupling lens 2203. Outgoing light from the coupling lens 2203 enters the diffraction grating 2204 to be separated into diffracted lights with a plurality of orders.

In this case, zero-order diffracted light 2209 is focused on an end face of the optical fiber 2207 to be coupled to the fiber. The diffracted lights with the other orders are intercepted by an aperture 2210 provided in front of the optical fiber and do not leak out from the module. In addition, when the diffraction grating 2204 has a sufficiently small pitch, a large angle of diffraction can be obtained. Therefore, a configuration without using the aperture 2210 also is possible.

The semiconductor laser module of the present example enables the intensity of light emitted from the module to be suppressed within a safety standard without further providing an optical attenuation member such as an attenuation film, a polarization plate, or the like or using a control circuit such as one for stopping emission when the optical fiber comes off, while still using a conventional lens. As a result, an inexpensive laser module can be provided.

What is claimed is:

1. A coupling lens used for coupling a beam of light emitted from a semiconductor laser to an optical fiber, wherein the coupling lens is formed of a single lens, a diffraction lens formed of concentric zones is integrated on either one of an incident surface and an exit surface of the single lens, the diffraction lens has a positive refracting power, a relief function of the diffraction lens has an approximately isosceles triangular shape, and a depth W of the relief function satisfies the following formula:

$$0.6 \leq W(n-1)/\lambda \leq 1.0$$

where W indicates the depth of the relief function, n denotes a refractive index of a lens material, and $\lambda$ represents a wavelength of the semiconductor laser.

2. A coupling lens used for coupling a beam of light emitted from a semiconductor laser to an optical fiber, wherein the coupling lens is formed of a single lens, a diffraction lens formed of concentric zones is integrated on either one of an incident surface and an exit surface of the single lens, the diffraction lens has a positive refracting power, a relief function of the diffraction lens has an approximately triangular shape with its apex at a location between 25% and 45% of a relief period, and a depth W of the relief function satisfies the following formula:

$$0.9 \leq W(n-1)/\lambda \leq 1.2$$

where W indicates the depth of the relief function, n denotes a refractive index of a lens material, and $\lambda$ represents a wavelength of the semiconductor laser.

3. The coupling lens according to claim 2, wherein the relief function of the diffraction lens has an approximately triangular shape with its apex at a location between 30% and 40% of a relief period and the depth W of the relief function satisfies the following formula:

$$1.0 \leq W(n-1)/\lambda \leq 1.1$$

where W indicates the depth of the relief function, n denotes a refractive index of a lens material, and $\lambda$ represents a wavelength of the semiconductor laser.

4. The coupling lens according to claim 1 or 2, wherein first-order diffracted light from the diffraction lens is used for optical fiber coupling, and when a diffraction efficiency of zero-order diffracted light is $\eta_0$ and a diffraction efficiency of second-order diffracted light is $\eta_2$, the following formula is satisfied:

$$\eta_0 < \eta_2.$$

5. The coupling lens according to claim 1 or 2, wherein a diffraction efficiency $\eta_0$ of zero-order diffracted light from the diffraction lens satisfies the following formula:

$$\eta_0 < 7\%.$$

6. A coupling lens used for coupling a beam of light emitted from a semiconductor laser to an optical fiber, wherein the coupling lens is formed of a single lens, a diffraction lens formed of concentric zones is integrated on either one of an incident surface and an exit surface of the single lens, and the diffraction lens has a positive refracting power and is processed so as to be decentered with respect to an axis of rotational symmetry of a refractive lens, and when a diffraction efficiency of a diffracted light with an order used for optical fiber coupling out of diffracted lights from the diffraction lens is $\eta$, the following formula is satisfied:

$$25\% \leq \eta \leq 40\%.$$

7. The coupling lens according to claim 1 or 2, wherein when a diffraction efficiency of a diffracted light with an order used for optical fiber coupling out of diffracted lights from the diffraction lens is $\eta$, the following formula is satisfied:

$$25\% \leq \eta \leq 40\%.$$

8. The coupling lens according to claim 1, 2, or 6, wherein when a diffraction efficiency of a diffracted light with an order used for optical fiber coupling out of diffracted lights from the diffraction lens is $\eta$, the following formula is satisfied:

$$30\% \leq \eta \leq 37\%.$$

9. The coupling lens according to claim 1, 2, or 6, wherein a wavelength $\lambda$ of the semiconductor laser satisfies the following formula:

$$700 \text{ nm} < \lambda < 1400 \text{ nm}.$$

10. The coupling lens according to claim 1, 2, or 6, wherein a material of the lens is resin, and the diffraction lens is designed so that when a refractive index of the resin as the material and a wavelength of the semiconductor laser vary due to variation in temperature, a variation in focal length of the lens due to variation in the refractive index is corrected by a variation in focal length of the diffraction lens due to variation in the wavelength.

11. The coupling lens according to claim 1, 2, or 6, wherein a material of the lens is resin and when a focal length of the lens as a whole is f and a focal length of the diffraction lens is fd, the following formula is satisfied:

$$2 < fd/f < 5.$$

12. A semiconductor laser module, comprising, at least:
a semiconductor laser;
an optical fiber;
a fixing member for fixing an incident end of the optical fiber; and
a coupling lens for allowing a beam of light emitted from the semiconductor laser to form an image on the incident end of the optical fiber,
wherein the coupling lens is the coupling lens according to claim 1, 2, or 6.

13. The semiconductor laser module according to claim 12, wherein a wavelength $\lambda$ of the semiconductor laser satisfies the following formula:

$$700 \text{ nm} < \lambda < 1400 \text{ nm}.$$

14. A semiconductor laser module, comprising, at least:
a semiconductor laser;
an optical fiber;
a fixing member for fixing an incident end of the optical fiber; and
a coupling lens for allowing a beam of light emitted from the semiconductor laser to form an image on the incident end of the optical fiber,
wherein the coupling lens is the coupling lens according to claim 1, 2 or 6 and is fixed so as to be tilted with respect to an optical axis.

15. The semiconductor laser module according to claim 14, wherein a wavelength $\lambda$ of the semiconductor laser satisfies the following formula:

$$700 \text{ nm} < \lambda < 1400 \text{ nm}.$$

16. A coupling lens used for coupling a beam of light emitted from a semiconductor laser to an optical fiber, wherein the coupling lens is made of glass and is formed of a single lens, and a diffraction grating is formed on either one of an incident surface and an exit surface of the single lens zero-order diffracted light from the diffraction grating is used for optical fiber coupling, and a diffraction efficiency $\eta_0$ of the zero-order diffracted light satisfies the following formula:

$$25\% \leq \eta_0 \leq 40\%.$$

17. The coupling lens according to claim 16, wherein a diffraction efficiency $\eta_0$ of the zero-order diffracted light satisfies the following formula:

$$30\% \leq \eta_0 \leq 37\%.$$

18. A semiconductor laser module, comprising, at least:
a semiconductor laser;
an optical fiber;
a fixing member for fixing an incident end of the optical fiber; and
a coupling lens for allowing a beam of light emitted from the semiconductor laser to form an image on the incident end of the optical fiber,
wherein the coupling lens is the coupling lens according to claim 16.

19. The semiconductor laser module according to claim 18, wherein a wavelength $\lambda$ of the semiconductor laser satisfies the following formula:

$$700 \text{ nm} < \lambda < 1400 \text{ nm}.$$

20. A coupling lens used for coupling a beam of light emitted from a semiconductor laser to an optical fiber,
wherein the coupling lens is formed of a single lens, a diffraction lens formed of concentric zones is integrated on either one of an incident surface and an exit surface of the single lens, the diffraction lens has a positive refracting power, and when a diffraction efficiency of a diffracted light with an order used for optical fiber coupling out of diffracted lights from the diffraction lens is $\eta$, the following formula is satisfied:

$$25\% \leq \eta \leq 40\%.$$

21. The coupling lens according to claim 20, wherein a wavelength $\lambda$ of the semiconductor laser satisfies the following formula:

$$700 \text{ nm} < \lambda < 1400 \text{ nm}.$$

22. The coupling lens according to claim 20, wherein when a diffraction efficiency of a diffracted light with an order used for optical fiber coupling out of diffracted lights from the diffraction lens is $\eta$, the following formula is satisfied:

$$30\% \leq \eta \leq 37\%.$$

23. The coupling lens according to claim 20, wherein a relief function of the diffraction lens has an approximately triangular shape with its apex at a location between 25% and 50% of a relief period, and when the location of the apex is X and a depth of the relief function is W, W satisfies the following formula:

$$-2.5X+1.66 \leq W(n-1)/\lambda \leq -1.6X+1.8.$$

24. The coupling lens according to claim 20, wherein a relief function of the diffraction lens has an approximately triangular shape with its apex at a location between 25% and 50% of a relief period, and when the location of the apex is X and a depth of the relief function is W, W satisfies the following formula:

$$-2.5X+1.75 \leq W(n-1)/\lambda \leq -1.6X+1.71.$$

25. The coupling lens according to claim 20, wherein a relief function of the diffraction lens has an approximately triangular shape with its apex at a location between 25% and 50% of a relief period, and when the location of the apex is X and a depth of the relief function is W, W satisfies the following formula:

$$-2.4X+1.67 \leq W(n-1)/\lambda \leq -1.94X+1.86.$$

26. The coupling lens according to claim 20, wherein a relief function of the diffraction lens has an approximately triangular shape with its apex at a location between 25% and 50% of a relief period, and when the location of the apex is X and a depth of the relief function is W, W satisfies the following formula:

$$-2.4X+1.76 \leq W(n-1)/\lambda \leq -1.94X+1.77.$$

27. The coupling lens according to any one of claims 23 to 26, wherein the relief function of the diffraction lens has an approximately triangular shape with its apex at a location between 30% and 40% in the relief period.

28. A semiconductor laser module, comprising, at least:
a semiconductor laser;
an optical fiber;
a fixing member for fixing an incident end of the optical fiber; and
a coupling lens for allowing a beam of light emitted from the semiconductor laser to form an image on the incident end of the optical fiber,
wherein the coupling lens is the coupling lens according to claim 20.

29. The coupling lens according to claim 20, wherein a material of the lens is resin and the diffraction lens is designed so that when a refractive index of the resin as the material and a wavelength of the semiconductor laser vary due to variation in temperature, a variation in focal length of the lens due to variation in the refractive index is corrected by a variation in focal length of the diffraction lens due to variation in the wavelength.

30. The coupling lens according to claim 20, wherein a material of the lens is resin and when a focal length of the lens as a whole is f and a focal length of the diffraction lens is fd, the following formula is satisfied:

$$2 < fd/f < 5.$$

31. A coupling lens used for coupling a beam of light emitted from a semiconductor laser to an optical fiber,
wherein the coupling lens is a pair of lenses of a refractive lens and a diffraction lens formed of concentric zones, the diffraction lens has a positive refracting power, and when a diffraction efficiency of a diffracted light with an order used for optical fiber coupling out of diffracted lights from the diffraction lens is $\eta$, the following formula is satisfied:

$$25\% \leq \eta \leq 40\%.$$

32. The coupling lens according to claim 31, wherein the diffraction lens is fixed with centers of concentric zones of the diffraction lens being decentered with respect to an optical axis of the refractive lens.

33. The coupling lens according to claim 31, wherein when a diffraction efficiency of a diffracted light with an order used for optical fiber coupling out of diffracted lights from the diffraction lens is $\eta$, the following formula is satisfied:

$$30\% \leq \eta \leq 37\%.$$

34. The coupling lens according to claim 31, wherein a wavelength λ of the semiconductor laser satisfies the following formula:

700 nm<λ<1400 nm.

35. The coupling lens according to claim 31, wherein a material of the lens is resin and the diffraction lens is designed so that when a refractive index of the resin as the material and a wavelength of the semiconductor laser vary due to variation in temperature, a variation in focal length of the lens due to variation in the refractive index is corrected by a variation in focal length of the diffraction lens due to variation in the wavelength.

36. The coupling lens according to claim 31, wherein a material of the refractive lens is resin and when a focal length of the lens as a whole is f and a focal length of the diffraction lens is fd, the following formula is satisfied:

2<fd/f<5.

37. The coupling lens according to claim 31, wherein a relief shape of the diffraction lens is formed of step-wise zones.

38. A semiconductor laser module, comprising, at least:
a semiconductor laser;
an optical fiber;
a fixing member for fixing an incident end of the optical fiber; and
a coupling lens for allowing a beam of light emitted from the semiconductor laser to form an image on the incident end of the optical fiber,
wherein the coupling lens is the coupling lens according to claim 31.

39. The semiconductor laser module according to claim 38, wherein a wavelength λ of the semiconductor laser satisfies the following formula:

700 nm<λ<1400 nm.

40. A semiconductor laser module, comprising, at least:
a semiconductor laser,
an optical fiber,
a fixing member for fixing an incident end of the optical fiber, and
a coupling lens for allowing a beam of light emitted from the semiconductor laser to form an image on the incident end of the optical fiber,
wherein a diffraction grating is positioned between the coupling lens and the optical fiber and a diffraction efficiency η of a diffracted light with an order used for optical fiber coupling out of diffracted lights from the diffraction grating satisfies the following formula:

25%≦η≦40%.

41. The semiconductor laser module according to claim 40, wherein a wavelength λ of the semiconductor laser satisfies the following formula:

700 nm<λ<1400 nm.

* * * * *